United States Patent [19]
Allen et al.

[11] Patent Number: 5,381,145
[45] Date of Patent: Jan. 10, 1995

[54] METHOD AND APPARATUS FOR PARALLEL DECODING AND ENCODING OF DATA

[75] Inventors: James D. Allen, Castro Valley; Matin Boliek, Palo Alto; Edward L. Schwartz, Sunnyvale, all of Calif.

[73] Assignees: Ricoh Corporation, Menlo Park, Calif.; Ricoh Company Ltd., Tokyo, Japan

[21] Appl. No.: 16,035

[22] Filed: Feb. 10, 1993

[51] Int. Cl.⁶ .............................................. H03M 7/30
[52] U.S. Cl. ...................................... 341/107; 341/51; 358/426; 348/397
[58] Field of Search ........................ 341/51, 63, 65, 67, 341/107; 358/426, 500, 261.1, 261.2, 261.3; 348/397

[56] References Cited

U.S. PATENT DOCUMENTS 4,973,961 11/1990 Chamzas et al. ....................... 341/51
5,097,261 3/1992 Langdon, Jr. et al. ................ 341/51
5,276,525 1/1994 Gharavi ............................... 358/426

OTHER PUBLICATIONS

Ono, et al., "Bi-Level Image Coding With Melcode Comparison of Block Type Code and Arithmetic Type Code" *IEEE Global Telecommunications Conference*, pp. 255–260 Nov. 1989.

*Primary Examiner*—Howard L. Williams
*Attorney, Agent, or Firm*—Blakely, Sokoloff, Taylor & Zafman

[57] ABSTRACT

The present invention provides a method and apparatus for encoding and decoding data in parallel. The present invention provides a system for decompressing a data stream having multiple codewords. The system includes an input channel that receives the data stream. The system also includes a decoder which decodes each bit of the data stream, wherein at least two of the codewords in the data stream are decoded at the same time, such that the data stream is decoded in parallel.

84 Claims, 23 Drawing Sheets

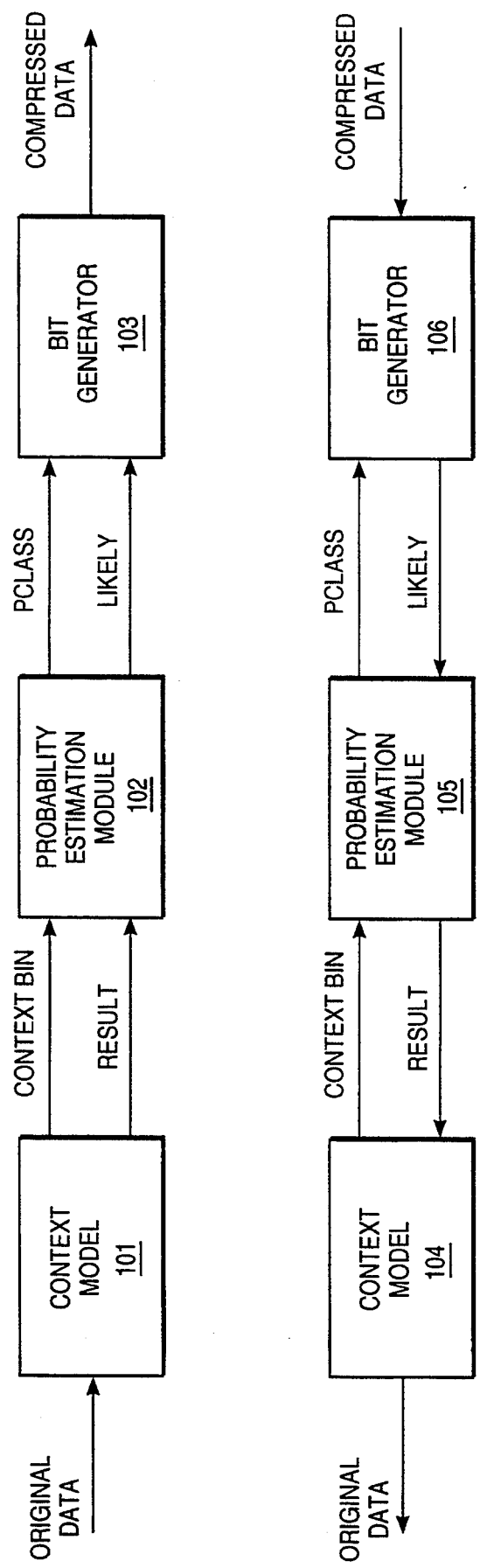

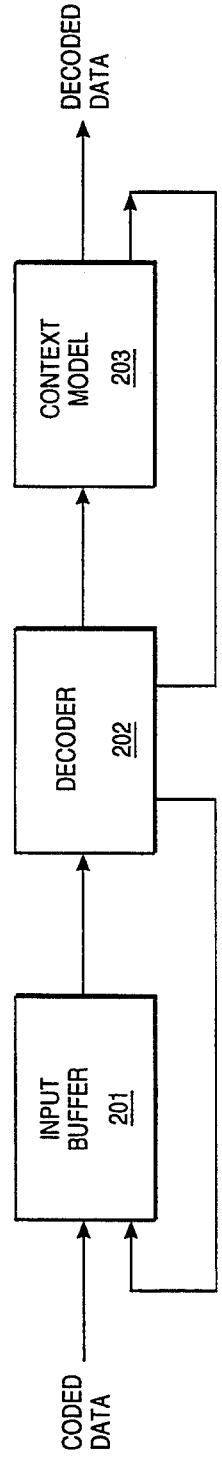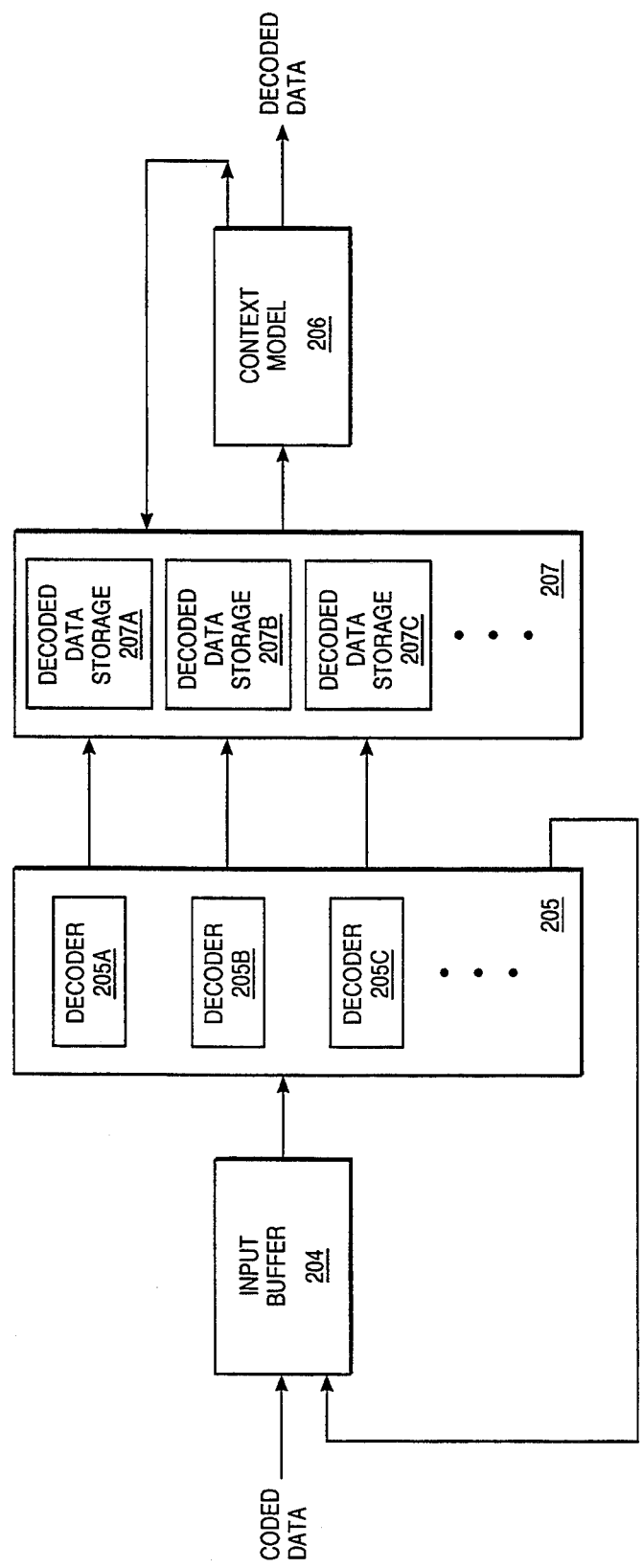

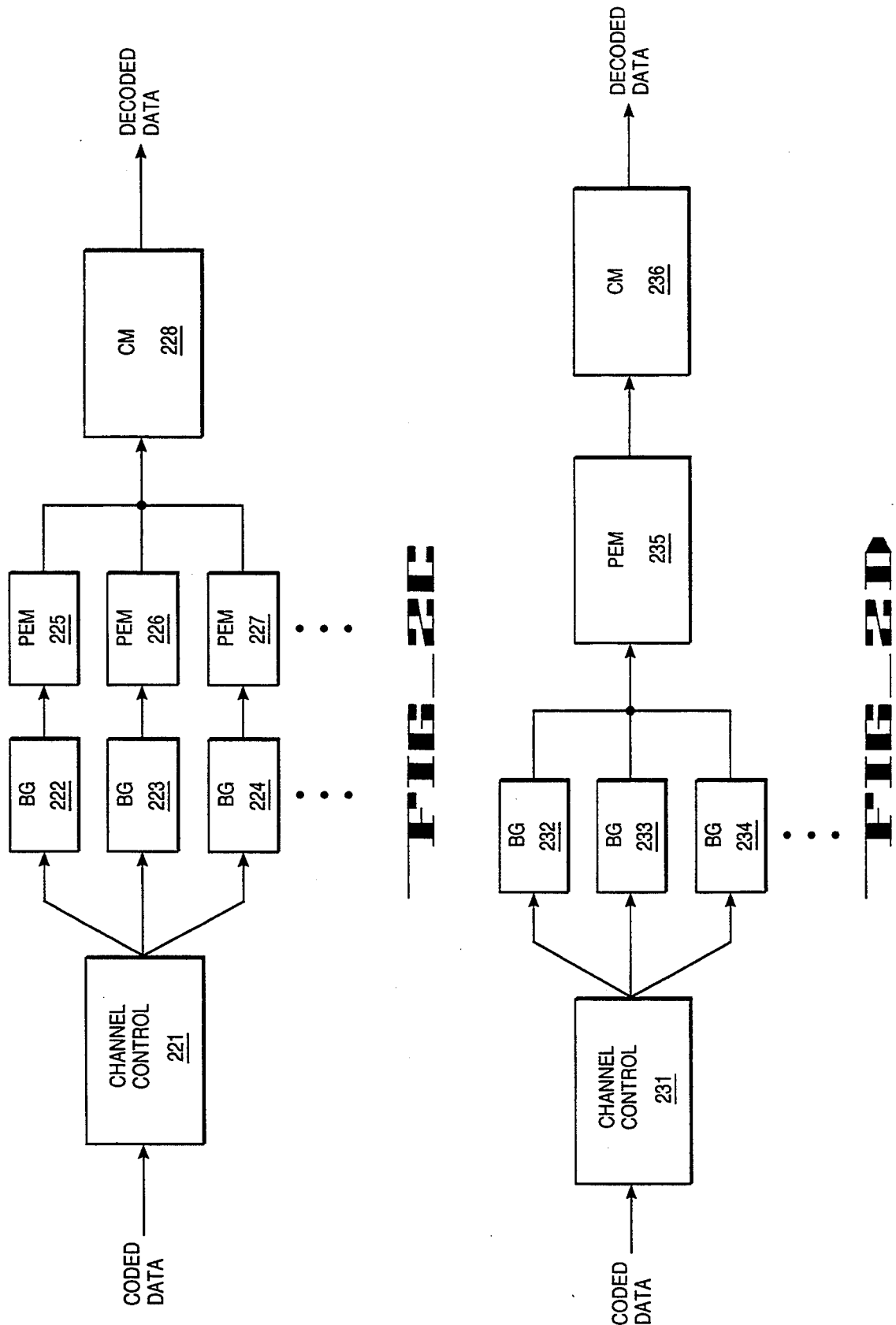

| STATE | CODE |
|---|---|
| −36 | R3(12) |
| −35 | R2(12) |
| −34 | R3(11) |
| −33 | R2(11) |
| −32 | R3(10) |
| −31 | R2(10) |
| −30 | R3(9) |
| −29 | R2(9) |
| −28 | R3(8) |
| −27 | R2(8) |
| −26 | R3(7) |
| −25 | R2(7) |
| −24 | R3(6) |
| −23 | R2(6) |
| −22 | R3(5) |
| −21 | R2(5) |
| −20 | R3(4) |
| −19 | R2(4) |
| −18 | R3(3) |
| −17 | R2(3) |
| −16 | R3(2) |
| −15 | R2(2) |
| −14 | R3(1) |
| −13 | R3(1) |
| −12 | R3(1) |

| STATE | CODE |
|---|---|
| −11 | R2(1) |
| −10 | R2(1) |
| −9 | R2(1) |
| −8 | R2(1) |
| −7 | R2(1) |
| −6 | R2(1) |
| −5 | R2(0) |
| −4 | R2(0) |
| −3 | R2(0) |
| −2 | R2(0) |
| −1 | R2(0) |
| −0 | R2(0) |
| 0 | R2(0) |
| 1 | R2(0) |
| 2 | R2(0) |
| 3 | R2(0) |
| 4 | R2(0) |
| 5 | R2(0) |
| 6 | R2(1) |
| 7 | R2(1) |
| 8 | R2(1) |
| 9 | R2(1) |
| 10 | R2(1) |
| 11 | R2(1) |

| STATE | CODE |
|---|---|
| 12 | R3(1) |
| 13 | R2(1) |
| 14 | R3(1) |
| 15 | R2(2) |
| 16 | R3(2) |
| 17 | R2(3) |
| 18 | R3(3) |
| 19 | R2(4) |
| 20 | R3(4) |
| 21 | R2(5) |
| 22 | R3(5) |
| 23 | R2(6) |
| 24 | R3(6) |
| 25 | R2(7) |
| 26 | R3(7) |
| 27 | R2(8) |
| 28 | R3(8) |
| 29 | R2(9) |
| 30 | R3(9) |
| 31 | R2(10) |
| 32 | R3(10) |
| 33 | R2(11) |
| 34 | R3(11) |
| 35 | R2(12) |
| 36 | R3(12) |

FIG_3

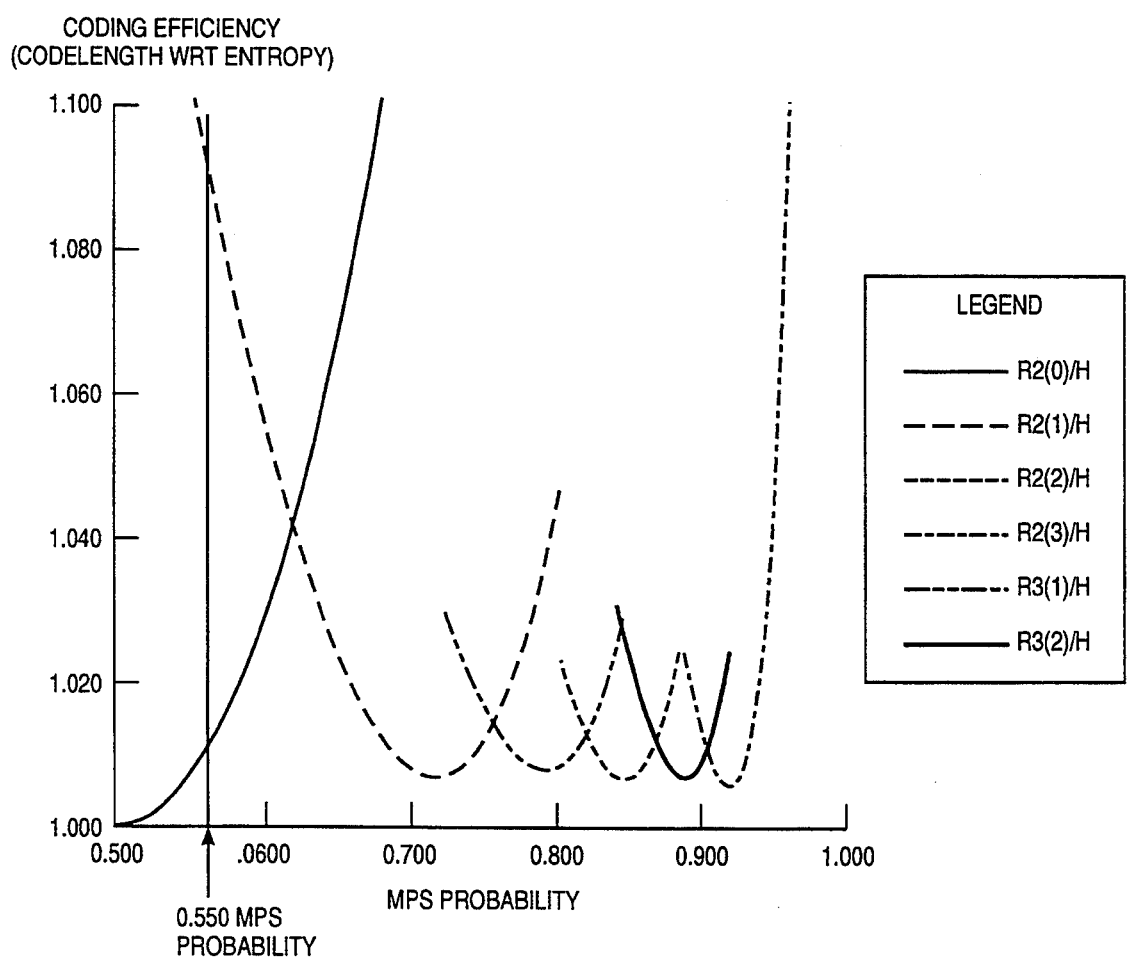
FIG_4

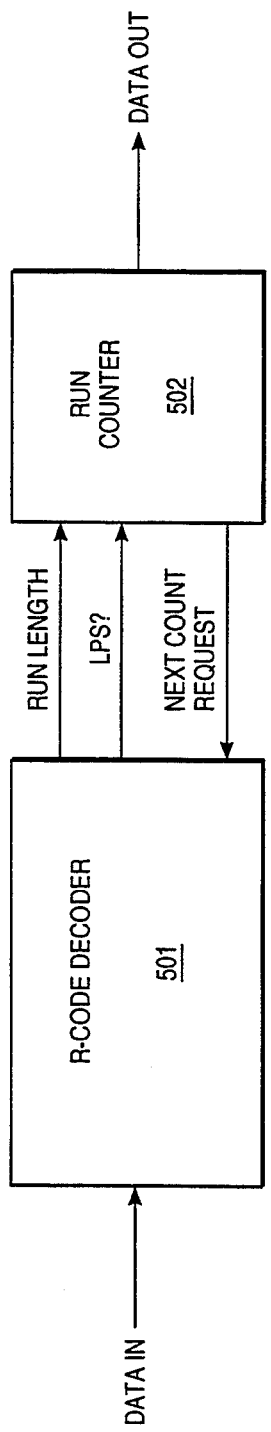
FIG_5
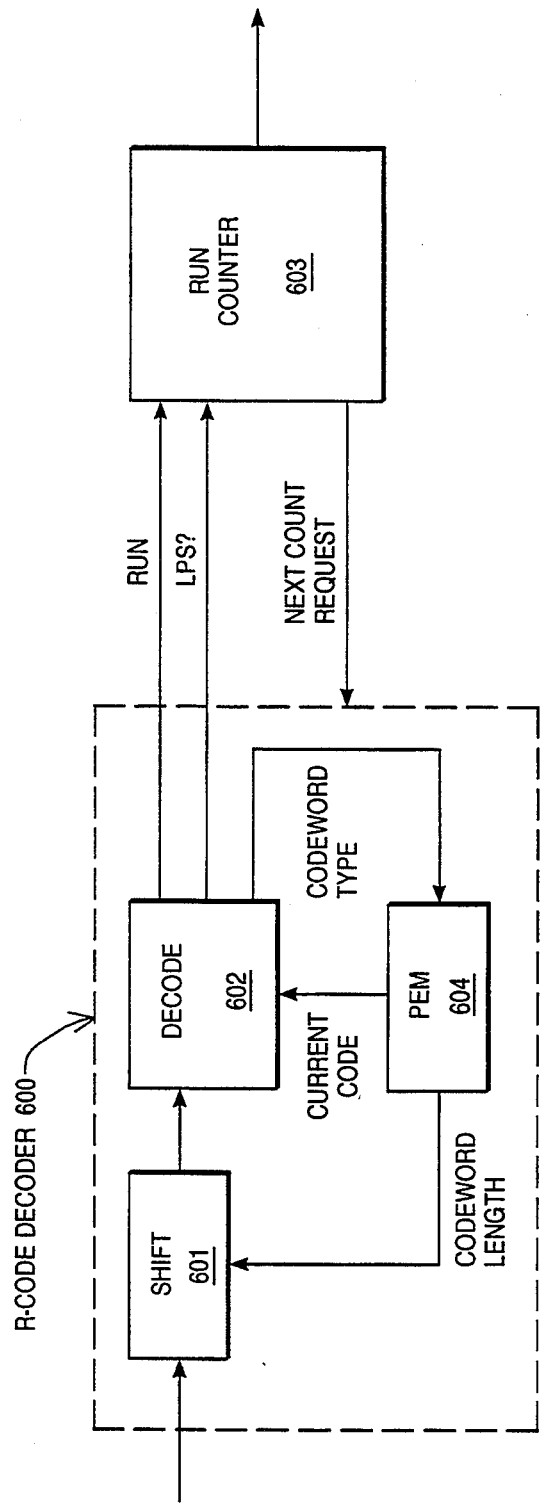
FIG_6

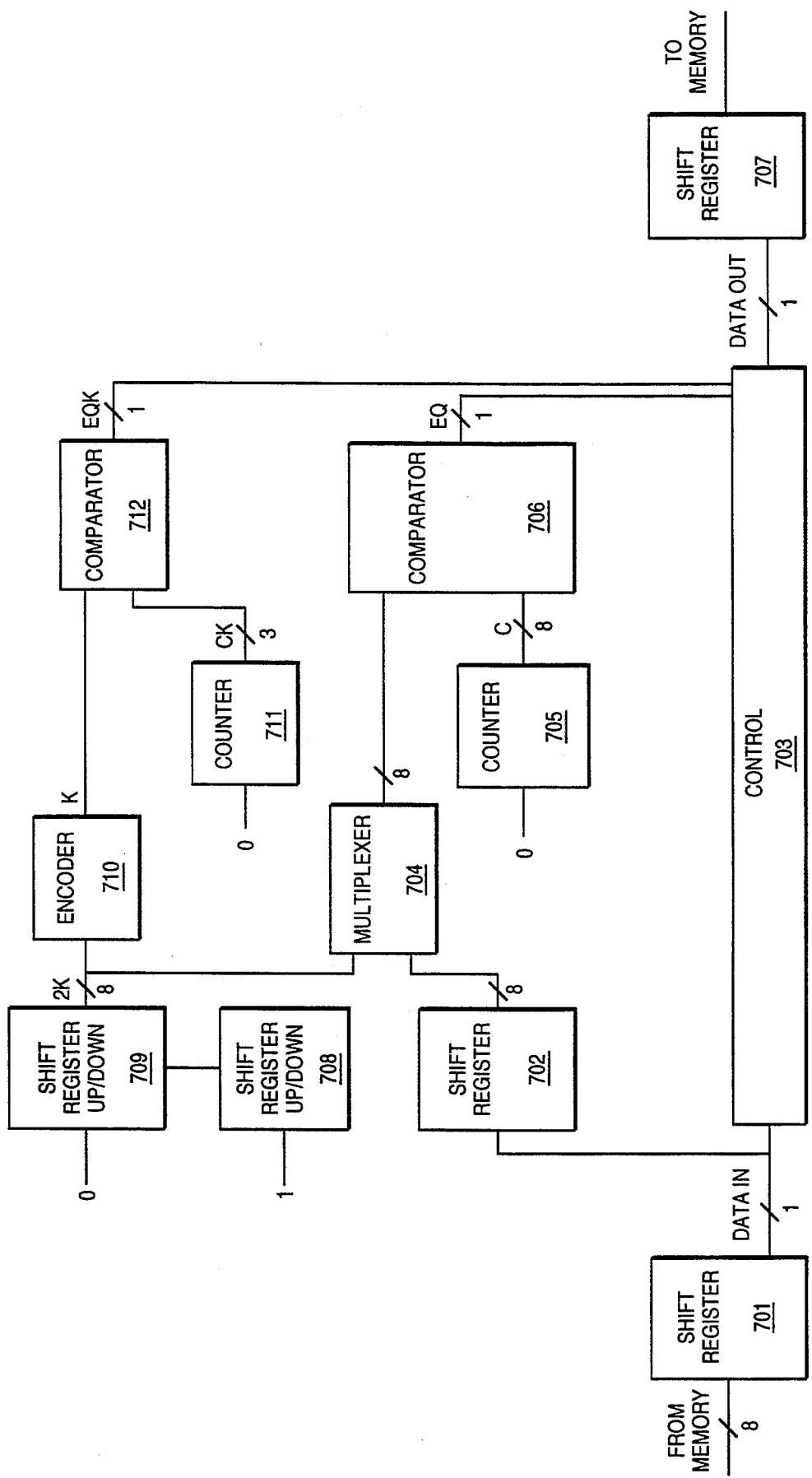
FIG_7

FIG_9

FIG_13

FIG_15

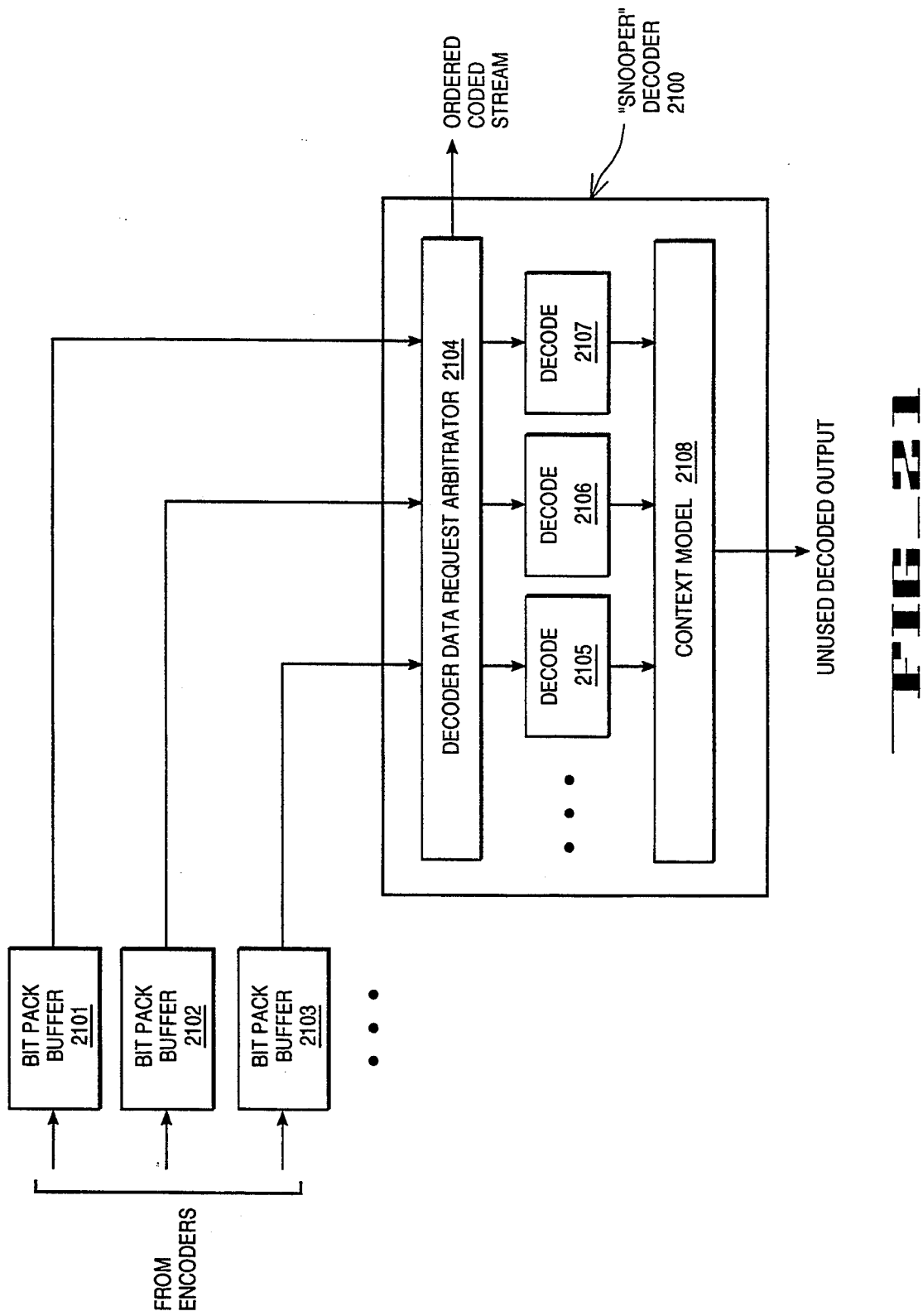
FIG_21

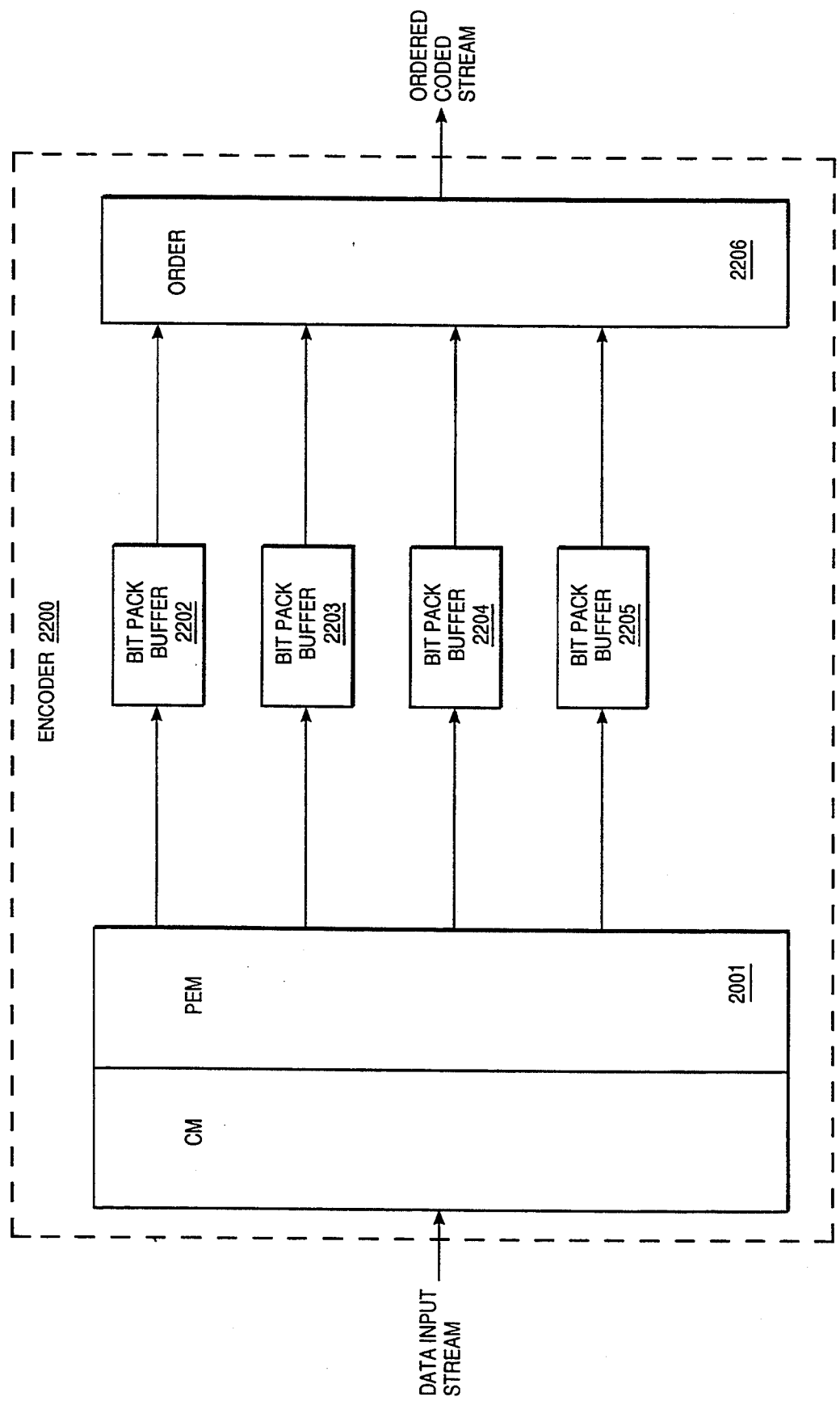
FIG_22

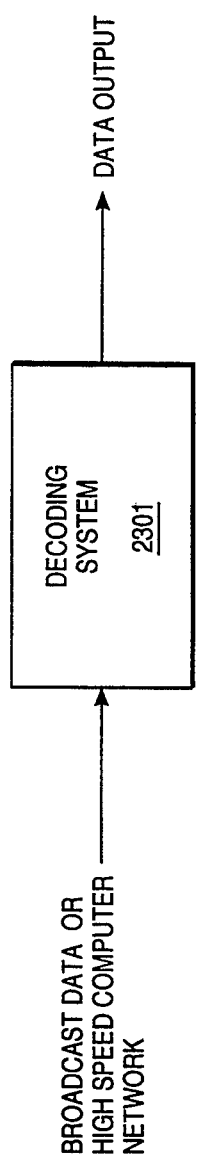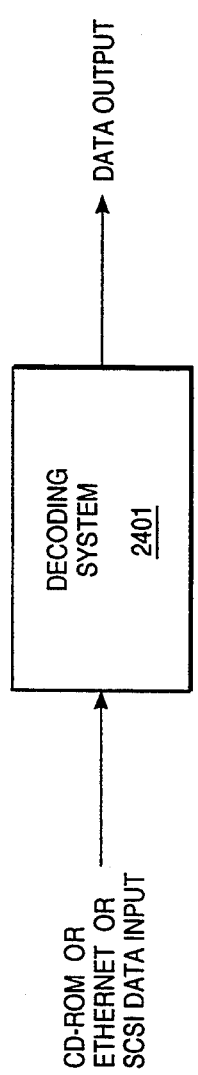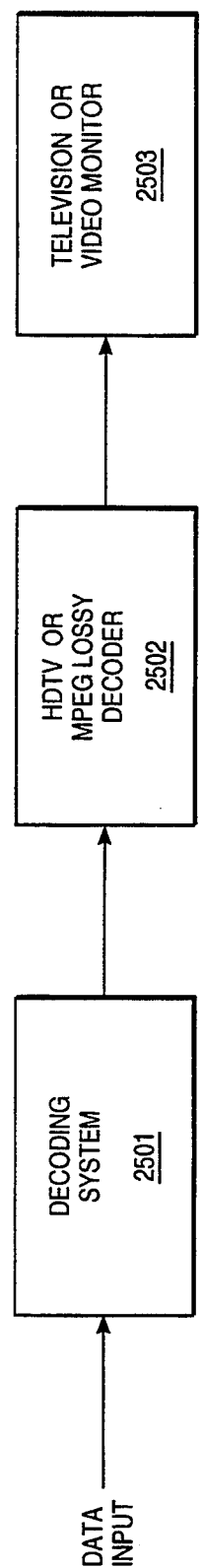

METHOD AND APPARATUS FOR PARALLEL DECODING AND ENCODING OF DATA

FIELD OF THE INVENTION

The present invention relates to the field of data compression and decompression systems; particularly, the present invention relates to a method and apparatus for parallel encoding and decoding of data in compression/decompression systems.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols are converted to output codewords. If the compression is successful, the codewords are represented in fewer bits than the number of input symbols. Lossless coding methods include dictionary methods of coding (e.g., Lempel-Ziv), run length encoding, enumerative coding and entropy coding. For more information on run length coding, see H. Meyr, H. G., Roskolsky, and T. S. Huang, "Optimum Run Length Codes," IEEE Transactions on Communications, Vol. COM-22, No. 6, June 1974, pgs. 826-835. See also G. G. Langdon, Jr. , "An Adaptive Run-Length Coding Algorithm," IBM Technical Disclosure Bulletin, Vol. 26, No. 7B, December 1983, pgs. 3783-3785 (A coding system using R2(k) codes for dynamically variable k values is attributed to Langdon). See S. W. Golomb, Run-Length Encoding, IEEE Trans. , IT-12, (July 1966), pg. 399. For more information regarding run length codes and their use in conjunction with facsimile transmission, see M. Takagi and T. Tsuda, "A Highly Efficient Run-Length Coding Scheme For Facsimile Transmission," Electronics and Communications in Japan, Vol. 58-A, No. 2, 1975, pgs. 30-38. See also U.S. Pat. No. 4,325,085, entitled "Method and Apparatus for Adaptive Facsimile Compression Using a Two Dimensional Maximum Likelihood Predictor" (R. P. Gooch), issued Apr. 13, 1982.

Entropy coding consists of any method of lossless (i.e. , perfect reconstruction is possible) coding which attempts to compress data close to the entropy limit using known or estimated symbol probabilities. Entropy codes include Huffman codes, arithmetic codes and binary entropy codes. Huffman coding uses a fixed length to variable length code which produces an integral number of bits for each symbol. However, Huffman coding cannot code symbols with less than one bit and, thus, cannot efficiently represent single symbols with probabilities of greater than 50%. Arithmetic coders are based on theoretical coding techniques involving infinite precision floating point numbers. However, arithmetic coders can only be implemented with finite precision arithmetic so their coding efficiency is reduced from the theoretical maximum. Practical arithmetic coders, such as the Q-coder of International Business Machines (IBM), use additional techniques that result in faster software or less hardware at the expense of compression efficiency. The Q-coder is a binary arithmetic coder in which additions have been substituted for multiplications, probabilities are limited to discrete values, and probability estimates are updated when bits are output.

Binary entropy coders are lossless (i.e., perfect reconstruction is possible) coders which act only on binary (yes/no) decisions, often expressed as the most probable symbol (MPS) and the least probable symbol (LPS). Examples of binary entropy coders include IBM's Q-coder and a coder referred to as the B-coder. The B-coder is a binary entropy coder which uses a finite state machine for compression. For more information on the B-coder, see U.S. Pat. No. 5,272,478 entitled "Method and Apparatus For Entropy Coding", issued Dec. 21, 1993.

FIG. 1 shows a block diagram of a prior art compression/decompression system using a binary entropy coder. For coding, data is input into context model (CM) 101. CM 101 translates the input data into a set or sequence of binary decisions and provides the context bin for each decision. Both the sequence of binary decisions and their associated context bins are output from CM 101 to the probability estimation module (PEM) 102. PEM 102 receives each context bin and generates a probability estimate for each binary decision. The actual probability estimate is typically represented by a class, referred to as PClass. Each PClass is used for a range of probabilities. PEM 102 also determines whether the binary decision (result) is or is not in its more probable state (i.e., whether the decision corresponds to the MPS). The bit-stream generator (BG) module 103 receives the probability estimate (i.e., the PClass) and the determination of whether or not the binary decision was likely as inputs. In response, BG module 103 produces a compressed data stream, outputting zero or more bits, to represent the original input data.

For decoding, CM 104 provides a context bin to PEM 105, and PEM 105 provides the probability class (PClass) to BG module 106 based on the context bin. BG module 106 is coupled to receive the probability class. In response to the probability class, BG module 106 returns a bit representing whether the binary decision (i.e., the event) is in its most probable state. PEM 105 receives the bit, updates the probability estimate based on the received bit, and returns the result to CM 104. CM 104 receives the returned bit and uses the returned bit to generate the original data and update the context bin for the next binary decision.

The context model is typically application specific. Since any type of data can be reduced to bits, a binary entropy coder with the proper context model can be used for any data. An example of a context model is given by the JBIG Standard (ISO/IEC International Standard, "Coded Representation of Picture and Audio Information-Progressive Bi-level Image Compression Standard").

"Model templates define a neighborhood around a pixel to be coded. The values of the pixels in these neighborhoods, plus spatial phase in differential layers, define a context."

Another example of a context model is given by the JPEG Standard (Digital Compression and Coding of Continuous-tone Still Images. ISO/IEC International Standard).

Since the context model is application specific, general coders are built by considering the probability estimation module and bit-stream generator only. Some probability estimation modules and bit-stream generators can be used interchangeably. Other probability estimation modules are dependent specifically on one particular bit-stream generator. For instance, IBM Q-coder is a combined probability estimation module and bit-stream generator. The B-coder is only a bit-stream generator. Therefore, the B-coder may be used with any probability estimation module.

One problem with decoders using binary entropy codes, such as IBM's Q-coder and the B-coder, is that they are slow, even in hardware implementation. Their operation requires a single large, slow feedback Iccp. To restate the decoding process, the context model uses past decoded data to produce a context. The probability estimation module uses the context to produce a probability class. The bit-stream generator uses the probability class and the compressed data to determine if the next bit is the likely or unlikely result. The probability estimation module uses the likely/unlikely result to produce a result bit (and to update the probability estimate for the context). The result bit is used by the context model to update its history of past data. All of these steps are required for decoding a single bit. Because the context model must wait for the result bit to update its history before it can provide the next context, the decoding of the next bit must wait. Therefore, parallel decoding of a single coded data stream does not occur in the prior art. It is desirable to decode data in parallel in order to increase the speed at which compressed data is decoded.

The present invention provides a lossless compression and decompression system. The present invention also provides a simple decoder which provides fast decoding. The present invention also provides a decoding system which decodes data in parallel. The present invention also provides an encoding system which encodes data such that it can be decoded in parallel.

SUMMARY OF THE INVENTION

The present invention provides a method and apparatus for encoding and decoding data in parallel. The present invention provides a system for decompressing a data stream having multiple bits. The system includes an input channel that receives the data stream. The system also includes a decoder which decodes each bit of the data stream, wherein at least two of the codewords in the data stream are decoded at the same time, such that the data stream is decoded in parallel.

In one embodiment, the present invention processes context bins in parallel. In another embodiment, the present invention processes probability classes in parallel.

In the present invention, coded data is supplied to many bit-stream generators. In one embodiment, multiple channels are used. In another embodiment, a single, non-interleaved channel is used. In another embodiment, a single, interleaved channel is used.

The present invention provides the use of R-codes in conjunction with the parallel decoding and encoding systems of the present invention. The R-coder of the present invention uses R2(k) codes in conjunction with at least one type of Rn(k) code, where n is a natural number. In one embodiment, the R-coder of the present invention uses R2(k) and R3(k) codes.

BRIEF DESCRIPTION OF THE DRAWINGS

The present invention will be understood more fully from the detailed description given below and from the accompanying drawings of the preferred embodiments of the invention which, however, should not be taken to limit the invention to the specific embodiments, but are for explanation and understanding only.

FIG. 1 is a block diagram of a prior art binary entropy encoder and decoder.

FIG. 2A is a block diagram of a prior art decoder.

FIG. 2B is a block diagram of the decoder of the present invention.

FIG. 2C is a block diagram of the decoder of the present invention which processes context bins in parallel.

FIG. 2D is a block diagram of the decoder of the present invention which processes probability classes in parallel.

FIG. 3 is one example of a probability estimation table and bit-stream generator for the R-coder of the present invention.

FIG. 4 is a graph of coding efficiency versus MPS probability.

FIG. 5 is a block diagram of the R-coder decompression system of the present invention.

FIG. 6 is a block diagram of one embodiment of the R-coder of the present invention.

FIG. 7 is a block diagram of an R-coder in the present invention.

FIG. 21 is a block diagram of one embodiment of the snooper decoder of the present invention.

FIG. 22 is a block diagram of one embodiment of the parallel encoding architecture of the present invention.

FIG. 23 is a block diagram of a high bandwidth system using the present invention.

FIG. 24 is a block diagram of a bandwidth matching system employing the present invention.

FIG. 25 is a block diagram of a real-time video system using the present invention.

DETAILED DESCRIPTION OF THE INVENTION

Figure 8:
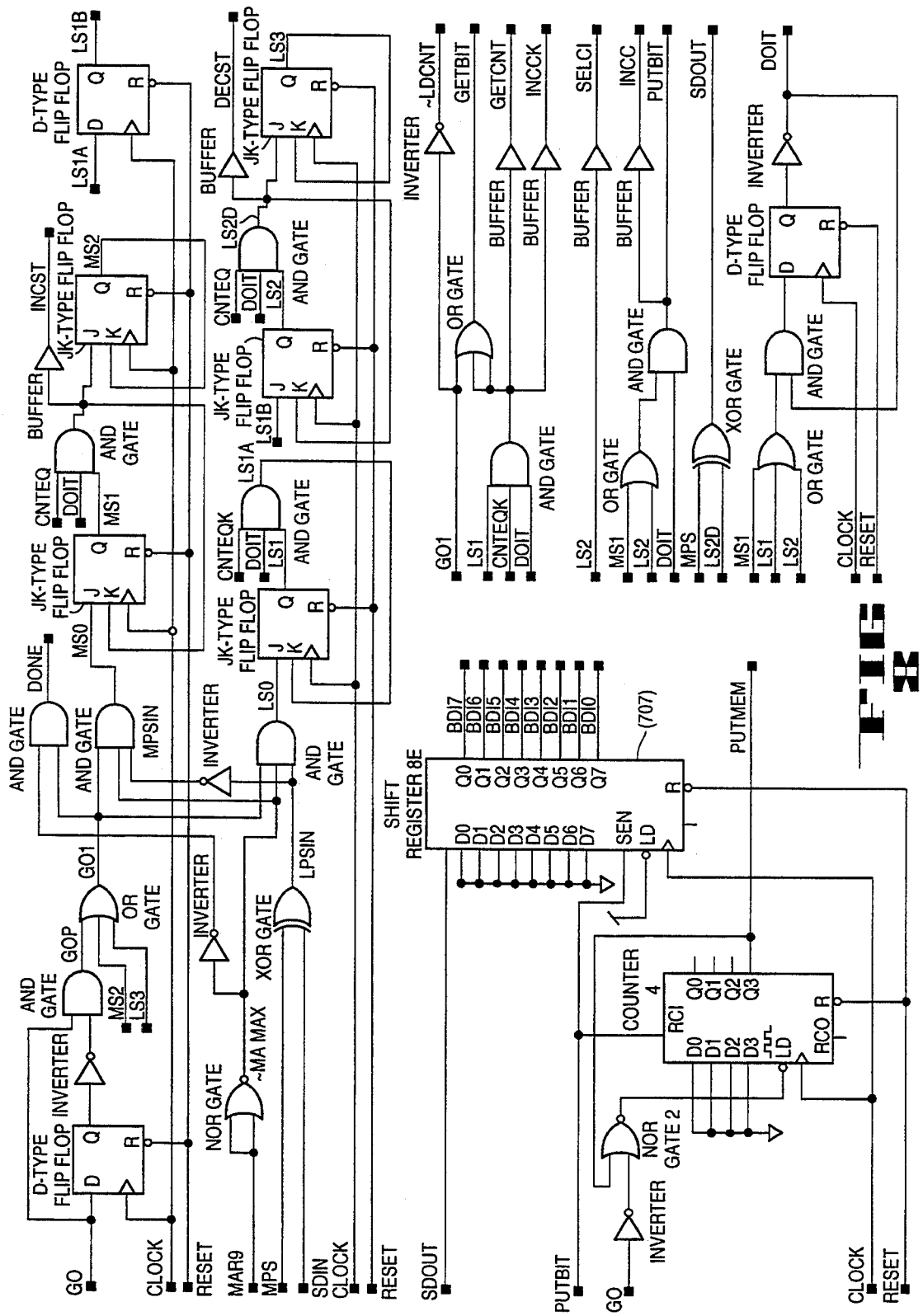
FIG. 8 is one example of a circuit schematic of the control logic of an R-coder according to the present invention.

A method and apparatus for parallel encoding and decoding of data is described. In the following description, numerous specific details are set forth, such as specific numbers of bits, numbers of coders, specific probabilities, types of data, etc., in order to provide a thorough understanding of the preferred embodiments of the present invention. It will be understood to one skilled in the art that the present invention may be practiced without these specific details. Also, well-known circuits have been shown in block diagram form rather than in detail in order to avoid unnecessarily obscuring the present invention.

General Overview of Parallel Decoding

The present invention provides a system which decodes losslessly encoded data in parallel. This invention is based on the observation that the bottleneck of most entropy compression systems is the feedback loop between the context model and the decoder. In the present invention, this loop is broken by dedicating coders to a given context bin, such that the system speed is dictated only by the smaller, faster feedback loop within the context model and the speed of codeword delivery to the system. The present invention achieves the decoupling between the coders and the context model through the recognition that the context model, in effect, reorders a coded data stream into a number of different data streams, one for each context bin. By having the coded data in order by context bin rather than pure data stream order, the coders can decode any or all of the coded data without waiting for feedback from the context model. (Note that these streams could be created by probability class instead of or as well as by context bin.)

FIG. 2A illustrates the traditional decoder with input buffer 201 coupled to receive the coded data and a feedback signal from decoder 202. Input buffer 201 feeds the coded data to decoder 202 according to the decoder's request via the feedback signal. Decoder 202 decodes the coded data according to its context and its probability estimate and supplies the decoded data to context model 203 which outputs the decoded data. Once decoder 202 sends the decoded data to context model 203, context model 203 is able to update the context and send the necessary information over a feedback signal to decoder 202 to begin decoding the next bit. In turn, decoder 202 requests more coded data from input buffers 201 using its feedback signal. Thus, two feedback signals operate sequentially to decode the coded data stream.

FIG. 2B illustrates the decoder of the present invention without the slow feedback loop of the prior art. As in FIG. 2A, an input buffer 204 receives coded data (i.e., codewords) and a feedback signal from decoder 205 and supplies coded data in context bin order to decoder 205 of the present invention, which decodes the coded data. Decoder 205 comprises multiple decoders (e.g., 205A, 205B, 205C, etc.), one for each context bin. Each of the decoders in decoder 205 is supplied coded data for its corresponding context bin from input buffer 204. Each decoder 205A, 205B, 205C, etc. produces the decoded data for its context bin. The context model is not required to associate coded data with a particular context bin. The decoded data is sent by decoder 205 to decoded data storage 207 (e.g., 207A, 207B, 207C, etc.).

Operating independently, context model 206 is coupled to receive the previously decoded data from decoded data storage 207 (i.e., 207A, 207B, 207C, etc.) in response to a feedback signal it sends to decoded data storage 207. Therefore, two independent feedback loops exist, one between decoder 205 and input buffer 204 and a second between context model 206 and decoder data storage 207. Since the large feedback loop is eliminated, the decoders in decoder 205 (e.g., 205A, 205B, 205C, etc.) are able to decode their associated codewords as soon as they are received from input buffer 204.

The context model provides the memory portion of the coding system and divides a set of data (e.g., an image) into different categories (e.g., context bins) based on the memory. In the present invention, the context bins are considered independent ordered sets of data. In one embodiment, each context bin has its own probability estimation model. Thus, each context bin could use a different probability estimation model and-/or bit-stream generator. Also in another embodiment, where probability estimation models are shared, each context bin can have its own state.

In the present invention, the context model divides the data (e.g., the image) into several data streams. In other words, the context model reorders a set of data or an image into multiple data streams, one for each context bin. In one embodiment, individual coders are dedicated to a given context bin.

By dedicating coders to a given context bin, the feedback loop between the context model and the coder can be eliminated. The feedback is eliminated because each coder does not need to receive an indication of the context for the previous bit before it can be decoded since the previous bit came from the same bin, i.e., it is the same context. In other words, there is no context feedback that must be completed before the next bit can be decoded.

The present invention delivers the separate coded data streams from each context bin in parallel, such that the bits for all of the context bins are received by the bit-stream generators in parallel. Each of the bit-stream generators returns a bit representing whether the binary decision is in its more probable state, which the probability estimation module uses to return decoded bits (i.e., the binary decision). The context model produces a decoded data stream by selecting the decoded bits from the bit-stream generators in the proper sequence, thereby recreating the original data. That is, the context model simply chooses the decoded results from the different codestreams in a manner similar to that of a multiplexer. Therefore, by having the coded data stream in order by context bin (or class) rather than in a specific order (e.g., raster scan), the coders can decode the coded data corresponding to any or all context bins without waiting for the feedback from the context model. It should be noted that the probability estimation model is not eliminated by the present invention, i.e. a probability estimation feedback loop remains.

Numerous implementations exist for the parallel decoding systems of the present invention. In one embodiment, the coded data streams corresponding to the multiple context bins can be interleaved into one stream ordered by the demands of the various coders. In the currently preferred embodiment of the present invention, the coded data is ordered such that each coder is constantly supplied with data even though the coded data is delivered to the decoder serially.

By using small simple coders that can be cheaply replicated in integrated circuits, coded data can be decoded quickly in parallel. In one embodiment, the coders are implemented in hardware using field programmable gate array (FPGA) chips or a standard cell application specific integrated circuit (ASIC) chip. The combination of parallelism and simple bit-stream generators allow the decoding of coded data to occur at speeds in excess of the prior art decoders, while maintaining the compression efficiency of the prior art decoding systems.

Binary entropy codes use multiple context bins and multiple probability estimate states (classes). The method and apparatus of the present invention allow parallelism to process context bins in parallel or handle probability classes in parallel. When processing context bins in parallel, a probability estimation module is associated with each bit-stream generator. It indicates to its associated bit-stream generator which code to utilize to produce a data stream from the input codewords. An example of such a system is shown in FIG. 2C where coded data is coupled as an input to channel control 221. Channel control 221 receives the coded data and directs coded data to each of multiple bit-stream generators (e.g., BG 222, BG 223, BG 224, etc.). Each of the bit-stream generators is coupled to receive the coded data and provides the result of whether the codeword was in its most likely state or not to its associated probability estimation module, in response to the probability class provided by the probability estimation module (PEM). PEMs 225, 226, 227, etc. are coupled to BGs 222, 223, 224, etc. respectively. Each bit-stream generators can operate independently of the others because it is decoding coded data which always has the same context bin. The context model 228 is coupled to each of the probability estimation modules and selects the probability estimation modules to obtain the decoded data in the determination order of the application. In this manner, decoded data is produced by processing context bins in parallel.

On the other hand, when handling probability classes in parallel, the context model and probability estimation model are combined. In this case, each bit-stream generator is assigned to a specific probability class and receives knowledge of the result. An example of a system which handles probability classes in parallel is shown in FIG. 2D. Referring to FIG. 2D, the coded data stream is coupled to channel control 231 for directing to one of multiple bit-stream generators (e.g., BG 232, BG 233, BG 234, etc.), which are coupled to receive it. Each of the bit-stream generators is coupled to PEM 235. PEM 235 is also coupled to CM 236. In this configuration, each of the bit-stream generators decodes coded data and the results of the decoding are selected by PEM 235 (instead of by CM 236). Each of the bit-stream generator receives coded data from a source associated with one probability class (i.e., where the coded data could from any context bin). PEM 235 selects the bit-stream generators using a probability class. The probability class is dictated by the context bin provided to it by CM 236. In this manner, decoded data is produced by processing probability classes in parallel.

By processing contexts and probability classes in parallel, the serial ordering of the code stream required in prior art decoders is avoided.

Note that the present invention operates with all types of data, including image data.

Types of Code and Bit-Stream Generator is for Parallel Decoding

The present invention could employ existing coders, such as Q-coders or B-coders, as the bit-stream generation elements which are replicated in parallel. However, other codes and coders may be used. The coders and their associated codes employed by the present invention are simple coders.

In the present invention, using a bit-stream generator with a simple code instead of complex code, such as the arithmetic code used by the Q-coder or the multi-state codes used by the B-coder, offers advantages. A simple code is advantageous in that the hardware implementation is much faster and simpler and requires less silicon than a complex code. Another advantage is that decoding efficiency can be improved. A code that uses a finite amount of state information cannot perfectly meet the Shannon entropy limit for every probability. Codes that allow a single bit-stream generator to handle multiple probabilities or contexts require constraints that reduce coding efficiency. Removing the constraints needed for multiple contexts or probability classes allows the use of codes that comes closer to meeting the Shannon entropy limit.

Two codes which may be used in the parallel decoding schemes of the present invention are R-codes and A-codes.

R-codes

The code (and coder) employed by the currently preferred embodiment of the present invention is referred to as an R-codes. R-codes are adaptive codes which include Golomb run length codes (i.e., R2(k) codes). In the currently preferred embodiment, the R-codes are parameterized so that many different probabilities can be handled by a single decoder design. Moreover, the R-codes of the present invention can be decoded by simple, high-speed hardware.

In the present invention, R-codes are used by an R-coder to perform encoding or decoding. In the currently preferred embodiment, an R-coder is a combined bit-stream generator and probability estimation module. For instance, in FIG. 1, an R-coder could include the combination of probability estimation module 102 and bit-stream generator 103 and the combination of probability estimation module 105 with bit-stream generator 106.

Codewords represent runs of the most probable symbol (MPS). A MPS represents the outcome of a binary decision with more than 50% probability. On the other hand, the least probable symbol (LPS) represents the outcome in a binary decision with less than 50% probability. Note that when two outcomes are equally probable, it is not important which is designated MPS or LPS as long as both the encoder and decoder make the same designation. The resulting bit sequence in the compressed file is shown in Table 1, for a given parameter referred to as MAXRUN.

TABLE 1

| Codeword | Bit-generation Encoding Meaning |
|---|---|
| 0 | MAXRUN Consecutive MPSs |
| 1 N | N Consecutive MPSs followed by LPS, N < MAXRUN |

To encode, the number of MPSs in a run are counted by a simple counter. If that count equals the MAXRUN count value, a 0 codeword is emitted into the codestream and the counter is reset. If an LPS is encountered, then a 1 followed by the bits N, which uniquely describe the number of MPS symbols before the LPS, is emitted into the codestream. (Note that there are many ways to assign the N bits to describe the run length ). Again the counter is reset. Note that the number of bits needed for N is dependent on the value of MAXRUN. Also note that the 1's complement of the codewords could be used.

To decode, if the first bit in the codestream is 0, then the value of MAXRUN is put in the MPS counter and the LPS indication is cleared. Then the 0 bit is discarded. If the first bit is a 1, then the following bits are examined to extract the bits N and the appropriate count (N) is put in the MPS counter and the LPS indicator is set. Then the codestream bits containing the 1N codeword am discarded.

R-codes are generated by the rules in Table 1. Note that the definition of a given R-code Rx(k) is defined by the MAXRUN. For instance:

MAXRUN for $Rx(k)=x*2^{k-1}$, thus

MAXRUN for $R2(k)=2*2^{k-1}$,

MAXRUN for $R3(k)=3*2^{k-1}$, etc. ...

Note that R-codes are an extension of Golomb codes. Golomb codes use R2(•) codes only. The R-codes of the present invention allow the use of both R2(k) and R3(k) codes, and other Rn(k) codes if desired. In one embodiment, R2(k) and R3(k) codes are used. Note that Rn exists for n=2 and n equals any odd number (e.g., R2, R3, R5, R7, R9, R11, R13, R15). In one embodiment, for R2(k) code, the run count, r, is encoded in N; the run count, r, is described in k bits, such that 1N is represented with k+1 bits. Also in one embodiment, for an R3(k) code, the bits N can contain 1 bit to indicate if $n<2^{(k-1)}$ or $n>2^{(k-1)}$ and either k−1 or k bits to indicate the run count, r, such that the variable N is represented by a total k or k+1 bits respectively. In other embodiments, the 1's complement of N could be used in the codeword. In this case, the MPS tends to produce code streams with many 0s and LPS tends to produce code streams with many 1s.

Tables 2, 3, 4 and 5 depict some efficient R-codes utilized for the current preferred embodiment of the present invention. It should be noted that other run length codes may also be used in the present invention. An example of alternative run length code for R2(2) is shown in Table 6.

TABLE 2

R2(0)
p(0) = 0.500

| uncoded data | codeword |
|---|---|
| 0 | 0 |
| 1 | 1 |

TABLE 3

R2(1)
p(0) = 0.707

| uncoded data | codeword |
|---|---|
| 00 | 0 |
| 01 | 10 |
| 1 | 11 |

TABLE 4

R3(1)
p(0) = 0.794

| uncoded data | codeword |
|---|---|
| 000 | 0 |
| 001 | 100 |
| 01 | 101 |
| 1 | 11 |

TABLE 5

R2(2)
p(0) = 0.841

| uncoded data | codeword |
|---|---|
| 0000 | 0 |
| 0001 | 100 |
| 001 | 101 |
| 01 | 110 |
| 1 | 111 |

TABLE 6

| Alternative | R2(2) |
|---|---|
| 0000 | 0000 |
| 0001 | 111 |
| 001 | 101 |
| 01 | 110 |
| 1 | 100 |

Probability Estimation Model for R-Codes

In the currently preferred embodiment, the R2(0) code performs no coding: an input of 0 is encoded into a 0 and an input of 1 is encoded into a 1 (or vice versa) and is optimal for probabilities equal to 50%. In the currently preferred embodiment, an R3(0) code is not utilized. The R2(1) code of the currently preferred embodiment is optimal for probabilities equal to 0.707 (i.e., 70.7%) and the R3(1) is optimal for the 0.794 probability (79.4%). The R2(2) code is optimal for the 0.841 probability (84.1%). Table 7 below depicts the near-optimal Golomb code, where the probability skew is defined by the following equation:

Probability skew = −log$_2$ (LPS).

TABLE 7

| probability | probability skew | Best Golomb Code |
|---|---|---|
| .500 | 1.00 | R2(0) |
| .707 | 1.77 | R2(1) |
| .841 | 2.65 | R2(2) |
| .917 | 3.59 | R2(3) |

TABLE 7-continued

| probability | probability skew | Best Golomb Code |
|---|---|---|
| .958 | 4.56 | R2(4) |
| .979 | 5.54 | R2(5) |
| .989 | 6.54 | R2(6) |
| .995 | 7.53 | R2(7) |
| .997 | 8.53 | R2(8) |
| .999 | 9.53 | R2(9) |

Note that the codes are near-optimal in that the probability range, as indicated by the probability skew, is covering the space relatively evenly even though the optimal probabilities do not differentiate as much in the higher k values as in the lower k values.

An R2(k) for a fixed k is called a Golomb run-length code. However, a fixed k is only near-optimal for a fixed probability. It is noted that when coding at an optimal probability, an R-code according to the present invention uses a 0 and 1N codewords with equal frequency. In other words, half the time, the R-coder of the present invention outputs one code and the other half of the time, the R-coder outputs the other. By examining the number of 0 and 1N codewords, a determination can be made as to whether the best code is being used. That is, if too many 1N codewords are being output, then the run-length is too long; on the other hand, if too many 0 codewords are being output, then the run length is too short.

The probability estimation model used by Langdon examines the first bit of each codeword to determine whether the source probability is above or below the current estimate. Based on this determination, k is increased or decreased. For example, if a codeword indicating MPS is seen, the probability estimate is too low. Therefore, according to Langdon, k is increased by 1 for each 0 codeword. If a codeword indicating less than MAXRUN MPS followed by an LPS is seen, the probability estimate is too high. Therefore, according to Langdon, k is decreased by 1 for each 1N codeword.

The present invention allows more complex probability estimation than the simple increase or decrease of k by 1 every codeword. The present invention includes a probability estimation module state that determines the code to use. Many states may use the same code. Codes are assigned to states using a state table or state machine.

In the present invention, the probability estimate changes state every codeword output. Thus, in the present invention, the probability estimation module increases or decreases the probability estimate depending on whether a codeword begins with a 0 or a 1. For instance, if a "0" codeword is output, an increase of the estimate of the MPS probability occurs. On the other hand, if a "1" codeword is output, the estimate of MPS probability is decreased.

The Langdon coder of the prior art only used R2(k) codes and increased or decreased k for each codeword. The present invention, alternatively, uses R2(k) and R3(k) codes, in conjunction with the state table or state machine, to allow the adaptation rate to be tuned to the application. That is, if there is a small amount of stationary data, adaptation must be quicker to result in more optimal coding, and where there is a larger amount of stationary data, the adaptation time can be longer so that the coding can be chosen to achieve better compression on the remainder of the data. Note that where variable numbers of state changes can occur, application specific characteristics may also influence the adaptation rate. Because of the nature of the R-codes, the estimation for R-codes is simple and requires little hardware, while being very powerful.

The incorporation of the R3(k) codes allows more probability space to be covered with a finer resolution. An example probability estimation state table according to the present invention is shown in FIG. 3. Referring to FIG. 3, the probability estimation state table includes both a state counter and the code associated with each of the separate states in the table. Note that the table includes both positive and negative states. The table is shown having 37 positive state and 37 negative states, including the zero states. The negative states signify a different MPS than the positive states. In one embodiment, the negative states can be used when the MPS is 1 and the positive states can be used when the MPS is 0, or vice versa. Note that the table shown in FIG. 3 is an example only and that other tables might have more or less states and a different state allocation.

Initially, the coder is in state 0 which is the R2(0) code (i.e., no code) for probability estimate equal to 0.50. After each codeword is processed, the state counter is incremented or decremented depending on the first bit of the codeword. In the currently preferred embodiment, a codeword of 0 increases the magnitude of a state counter; a codeword stating with 1 decreases the magnitude of the state counter. Therefore, every codeword causes a change to be made in the state by the state counter. In other words, the probability estimation module changes state. However, consecutive states could be associated with the same code. In this case, the probability estimation is accomplished without changing codes every codeword. In other words, the state is changed every cycle; however, the state is mapped into the same probabilities at certain times. For instance, states 5 to −5 all use the R2(0) code, while states 6 through 11 and −6 through −11 use the R2(1) code. Using the state table of the present invention, probability estimation is allowed to stay with the same coder in a non-linear manner.

It should be noted that more states with the same R-code are included for the lower probabilities. This is done because the loss of efficiency when using the wrong code at low probabilities is great. The nature of the run length codes state table is to transfer between states after each codeword. In a state table designed to change codes with every change in state, when toggling between states at the lower probabilities, the code toggles between a code which is very close to the entropy efficiency limit and code which is far from the entropy efficiency limit. Thus, a penalty (in terms of the number of coded data bits) can result in the transition between states. Prior art probability estimation modules, such as Langdon's probability estimation module, lose performance because of this penalty.

In the higher probability run length codes, the penalty for being in the wrong code is not as great. Therefore, in the present invention, additional states are added at the lower probabilities, so that the changes of toggling between the two correct states are increased, thereby reducing the coding inefficiency. FIG. 4 illustrates this graph of coding efficiency (codelength normalized with respect to entropy) versus MPS probability. FIG. 4 shows how some of the R-codes of the present invention cover the probability space. As an example, FIG. 4 shows that for a MPS probability of approximately 0.55, the efficiency of the R2(0) code is 1.01 (or 1% worse than) the entropy limit. In contrast, the R2(1) code has an efficiency of 1.09 (or 9% worse than) the entropy limit. This example shows that using the wrong code for this particular low probability case cause an 8% loss in coding efficiency.

Note that in certain embodiments, the coder may have initial probability estimate state. In other words, the coder could start in a predetermined one of the states, such as state 18. In one embodiment, a different state table could be used so that some states would be used for the first few symbols to allow for quick adaptation, and a second state table could be used for the remaining symbols for slow adaptation to allow fine-tuning of the probability estimate. In this manner, the coder may be able to use a more optimal code sooner in the coding process. In another embodiment, the code stream could specify an initial probability estimate for each context. In one embodiment, the increments and decrements are not made according to a fixed number (e.g., 1). Instead, the probability estimate state can be incremented by a variable number according to the amount of data already encountered or the amount of change in the data (stability).

If the state table is symmetric, as the example table of FIG. 3 shows, only half of it (including the zero state) needs to be stored. In one embodiment, the state number is stored in sign magnitude (1s) complement form to take advantage of the symmetry. In this manner, the table can be utilized by taking the absolute value of the ones complement number to determine the state and examining the sign to determine whether the MPS is a 1 or 0. This allows the hardware needed for incrementing and decrementing the state to be reduced because the absolute value of the state is used to index the table and the computation of the absolute value of ones complement number is trivial. In another embodiment, for greater hardware efficiency, a state table can be replaced by a hardwired or programmable state machine.

Example of a Hardware Implementation

FIG. 5 shows a block diagram of a decoding system using R-codes. Referring to FIG. 5, an R-code decoder 501 is coupled to the coded input data and outputs a run length and an indication of whether the LPS occurred (e.g., a 1N code). Run counter 502 is coupled to receive the run length and the LPS indication from R-code decoder 501 and outputs the reconstructed original data. Run counter 502 also outputs a signal, which R-code decoder 401 is coupled to receive, requesting the next count.

In order to use an R-code, decoder 501 examines the codewords received as coded data inputs and determines the run length for the current codeword. R-code decoder 501 also determines if the LPS is at the end of the run. In response to the run length (i.e., the run count) and LPS determinations, run counter 502 outputs as many MPS as the value of the run count and a LPS, if decoder 501 indicates. When the LPS determination results in a "no" output to run counter 502, then run counter 502 emits only MPSs. (Note that in a Q-coder, arithmetic is required to output the bits, while in the present invention only a counter is needed.)

Run counter 502 actually outputs the bits. It should be noted that run counter 502 functions in part as the decoded data storage 207 of FIG. 2B. In one embodiment, run counter 502 only outputs the required number of MPS bits followed by an LPS bit, if required. Run counter 502 sends a signal (next count request) indicating when it is finished with the codeword and requests another. In this manner, run counter 502 is simple and fast. R-code decoder 501 performs a bit shift for the next codeword in response to the signal from run counter 502. R-code decoder 501 also updates the probability estimation module state.

FIG. 6 is a block diagram depicting another embodiment of the R-coder of the present invention. Referring to FIG. 6, R-coder 600 comprises shift block 601, decode block 602, run counter 603 and PEM 604. Shift block 601 is coupled to the coded data input stream of codewords. Shift block 601 is also coupled to receive a feedback signal from PEM 604 which indicates the length of the current codeword (i.e., the amount to shift). Shift block 601 outputs a signal (properly aligned coded data) which is coupled to an input of decode block 602. Decode block 602 is also coupled to receive a feedback signal from PEM 604 to indicate the current code. PEM 604 also is coupled to a signal from decode block 602. Decode block 602 determines the current run length and whether an LPS is at the end of the run. Decode block 602 outputs two signals, the run length (RL) and the LPS indication, both of which are coupled to inputs of counter 603. Counter 603 is also coupled to a signal output to PEM 604. Counter 603 generates the reconstructed data. Counter 603 keeps track of the run count counter and whether an LPS needs to be emitted. Counter 603 also emits the decoded data and indicates when to process the next codeword. PEM 604 is coupled to receive from counter 603 the indication of when the next codeword is to be processed (Next count request).

PEM 604 determines the amount to shift to process the next codeword from shift block 601, the current code for decode block 602 and the next state and MPS for updating its internal state. The form of the current code is a bit mask for decode block 602 to enable only the bits of the current code word to be decoded. Each of these functions is indicated to the requisite block (i.e., to shift block 601, decode block 602 and counter 603) by separate feedback lines.

The operation of R-coders 600 begins when the code is presented to R-coder 600 starting at the first bit position to be decoded. Shift block 601 receives the coded data and supplies the coded data to decode block 602. In one embodiment, shift block 601 includes a barrel shifter. In one embodiment, shift block 601 supplies coded data to decode block 602 in parallel.

On the basis of the first bit, decode block 602 determines the codeword type. In one embodiment, the determination of the codeword type comprises determining if there is an LPS at the end of the run. In another embodiment, the determination of the codeword types also includes determining whether the second bit is a 1 or a 0. This is important in situations where the second bit provides an indication of the number of N bits in a 1N, such as with R3(1) where the number of bits following the 1 could be one or two bits.

In one embodiment, decode block 602 determines whether the run length is MAXRUN or is encoded in the N bits after a 1 (e.g., for 1N). PEM 604 passes the current code on the current code signal lines to indicate the number of bits in 1N codewords. The number of bits are indicated because more bits are needed when the code is longer.

The result of codeword type is indicated to PEM 604 via the codeword type signals. Using the current code and the codeword type, PEM 604 determines the codeword length. The codeword length is coupled to shift block 601. Shift block 601 uses the codeword length to properly align the data for the next codeword.

PEM 604 uses the codeword type to update probability estimation module state. The new probability estimation module state is used to determine the new current code for future use by the decode block 602. Counter 603 produces decoded data in the same manner as the run counter of FIG. 5.

Codes have variable lengths, such that if a code has a length of 3, the next codeword is positioned four bits away. Therefore, shift block 601 shifts to position four bits later in the code stream and sends data to decode block 602 at that point. In one embodiment, shift block 601 has an input from PEM 604 that signals shift block 601 when decode block 602 is finished with the current codeword, thereby causing shift block 601 to shift. After run counter 603 outputs the decoded data, it requests the next count from the R-code decoder 500. The entire decoding, probability estimation module and shift process is then repeated.

Most codewords result in multiple decoded bits when the decompression is effective. A system with multiple R-code decoders could share the less frequently used shifter, decoding and feedback modules among several counters modules. An example of such a system is described below later.

Therefore, by using R2(k) and R3(k) codes with the state tables/machine PEM, the present invention is able to perform decoding with near optimal compression. Also, since the state table PEM is employed, the present invention provides a simple probability estimation model implementation with low hardware cost and high speed hardware implementation.

An Example R-decoder Hardware Implementation in FPGAs

A simple R-coder implementation is shown in FIG. 7. The R-coder was designed using a CLi6005 brand FPGA from Concurrent Logic, Inc. of Sunnyvale, Calif. The probability estimation model associated with the R-coder of FIG. 7 is shown below:

TABLE 8

PEM State Table

| State | Code | State | Code |
|---|---|---|---|
| −11 | R2(7) | 11 | R2(7) |
| −10 | R2(6) | 10 | R2(6) |
| −9 | R2(5) | 9 | R2(5) |
| −8 | R2(4) | 8 | R2(4) |
| −7 | R2(3) | 7 | R2(3) |
| −6 | R2(2) | 6 | R2(2) |
| −5 | R2(1) | 5 | R2(1) |
| −4 | R2(0) | 4 | R2(0) |
| −3 | R2(0) | 3 | R2(0) |
| −2 | R2(0) | 2 | R2(0) |
| −1 | R2(0) | 1 | R2(0) |
| −0 | R2(0) | 0 | R2(0) |

Note that only R2codes are supported and R2(7) is the longest run length code in this embodiment.

Referring to FIG. 7, shift register 701 is coupled to receive coded data from memory on an 8-bit bus. Shift register 701 outputs coded data one bit at a time, which is coupled to control 703 and shift register 702. Shift register 702 is coupled to multiplexer 704. The loading of up/down shift register 708 is performed according to a logical 1 input. Shift register 708 is coupled to up/down shift register 709 which receives a logical 0 input. The output of shift register 709 is coupled as an input to encoder 710 and multiplexer 704. The output of multiplexer 704 is coupled to one input of comparator 706. The other input of comparator 706 is coupled to the output of counter 705. Counter 705 is coupled with counter 711. Counter 711 is coupled to one input of comparator 712. The other input of comparator 712 is coupled to the output of encoder 710. The output of comparator 712 is coupled to control 703, as is the output of comparator 706. The output of control 703 comprises the data which is coupled to the input of shift register 707 which receives the data serially and outputs the data in parallel. Note that control 703 is coupled to and controls the operation of the remaining blocks.

The circuit in FIG. 7 operates in the same manner as described for FIG. 6. Specifically, in this embodiment, shift registers 701 and 702 correspond to the shift block of FIG. 6. Up/down shift register 708 and 709 in conjunction with encoder 710, counter 711 and comparator 712 provides the probability estimation module of the R-coder in FIG. 6. The decode block of the R-coder is implemented by multiplexer 704, while the run counter is implemented using counter 705 and comparator 706.

Figure 9:
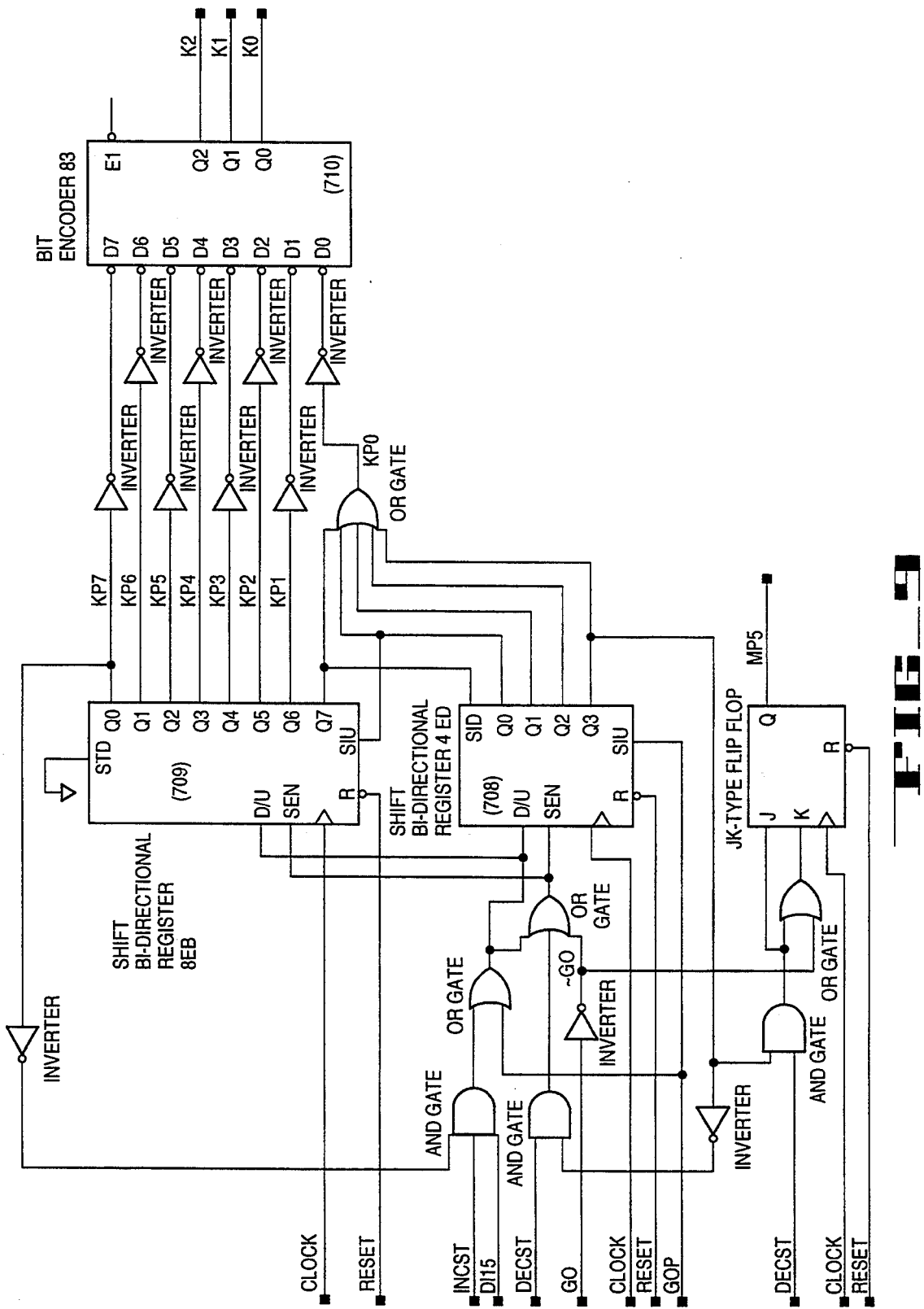
FIG. 9 is one example of a schematic for a PEM for an R-coder.
Figure 10:
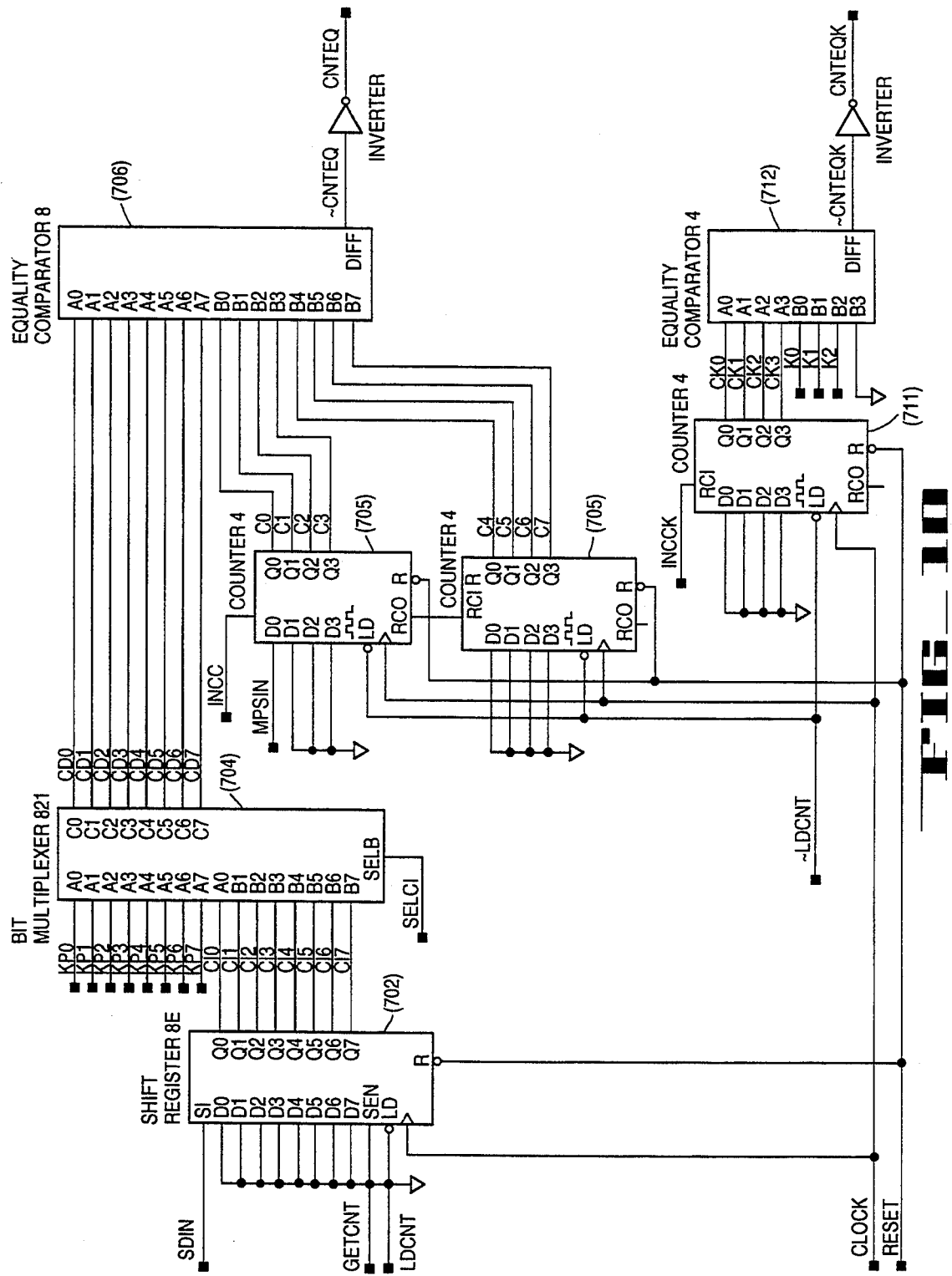
FIG. 10 is one example of a schematic for the shifter, decoder and counter of an R-coder.

One circuit implementation of FIG. 7 is shown in FIGS. 8–10. FIG. 8 is a circuit schematic of the control logic of the R-decoder of FIG. 7. FIG. 9 is a circuit schematic for the probability estimation module. FIG. 10 is a circuit schematic for the shifter, decoder and counter of the R-decoder of FIG. 7. The operation of each of the circuits shown in the schematic is well-known in the art. Note that the specific block in FIG. 7 of which the components in FIGS. 8–10 implement are designated in parenthesis. All other blocks which do not contain parenthesis correspond to control circuitry of which operation is well-known in the art.

A-Codes

The A-codes of the present invention are a variable length to variable length code optimized for a single probability. In other words, the A-codes of the present invention are not adaptive. The A codes of the present invention might be used in systems which perform parallel decoding of separate probability classes. An example of an A-code is an A1 code. The A1 code is given below:

```
00  → 0
01  → 10
1   → 11
```

The A1 code of the present invention is effective for MPS probabilities of approximately 0.71 (71%).

Another example of an A-code is an A2 code. The A2 code of the present invention is given below:

```
0000 → 0
0001 → 1000
0010 → 1001
0011 → 11111
010  → 101
011  → 11101
100  → 110
101  → 11110
11   → 11100
```

A-codes may be cascaded to accommodate different probabilities. With A-codes, a single variable length code is used as a building block that may be serially cascaded with variable length codes to generate a code stream at another probability. In implementation, a code at one probability is passed through a second coder to produce a code stream of another probability. For example, if the output of the A1 decoder depicted above is input into another A1 decoder, a cascaded A1 code results. Similarly, the output of an A2 decoder can be fed into an A1 decoder.

Configurations utilizing A-coder can be implemented, such that multiple cascaded codes are provided. In one embodiment, where a system is handling probability classes in parallel, each probability could be input into a different portion of the chain of A-code coders. That is, each of the A-coders receives the output of the previous A-coder and the probability class corresponding to data for one particular context bin, and upon the input of either, a code is produced at another probability.

The A-codes of the present invention are simple codes to implement in hardware. By cascading the A-coders together, the hardware required to implement the system is reduced.

The A-codes of the present invention can be decoded by small amounts of hardwired logic or small look-up tables for high speed operations. A-codes allow for an external probability estimation module to be used, such that any PEM may be used in the entropy coding system.

Parallel Decoding Systems

Non-interleaved Parallel Decoding Systems

The present invention uses non-interleaved channel or multi-channel coders in parallel to increase the coding speed in binary entropy coders. Decoders for binary entropy coders, such as IBM's Q-coders and B-coders, require a single large feedback loop between the decoder and the context model, as described previously. By using proper coded data transmission and multiple decoders, the context model feedback loop is isolated. By isolating the context model feedback loop, the context model may be reduced to selecting an already decoded result.

The separation between the functionality of the context model and the coders allows for parallelism to be employed in the present invention. In the currently preferred embodiment, the probability estimation module is combined with the context model (as with the B-coder) or with the bit-stream generator (as with the Q-coder). Each of the bit-stream generators is assigned to a distinct subset of the coded data, which may be associated with either context bins or probability classes depending on the implementation. In other words, in one embodiment, each of a group of bit-stream generators receive coded input data corresponding to one context or a class of context bins, or in another embodiment, each of the bit-stream generators receive coded input data corresponding to a probability class. Note that classes of context bins may be associated with one bit-stream generator where the number of context bins is greater than the number of coders.

By pipelining the context model and the bit-stream generator, the speed of the decoder is increased, limited only by the time required to complete the slower of these two operations, instead of the sum of the two. Because the bit-stream generators operate independently of the context model, multiple bit-stream generators can be used in parallel to increase speed.

The present invention may be implemented using pipelining techniques. Note that in the present invention, portions of the bit-stream generators can also be pipelined. Referring back to FIG. 6, input data may be input into the R-coder decoder while data is sent from decode block 602 to run counter 603. Similarly, pipelining may be employed between the R-code decoder and run counter 603. Pipelining may also be utilized in portions of decode block 602 and PEM 604 within R-code decoder.

Therefore, the present invention provides a system which can operate as fast as the context model (plus the speed required to perform a trivial multiplex operation when selecting the already decoded result).

In the present invention, coded data is supplied to many bit-stream generators. In one embodiment, multiple channels are used. In another embodiment, a single, non-interleaved channel is used. In another embodiment, a single, interleaved channel is used.

Multi-channel Coders

Figure 11:
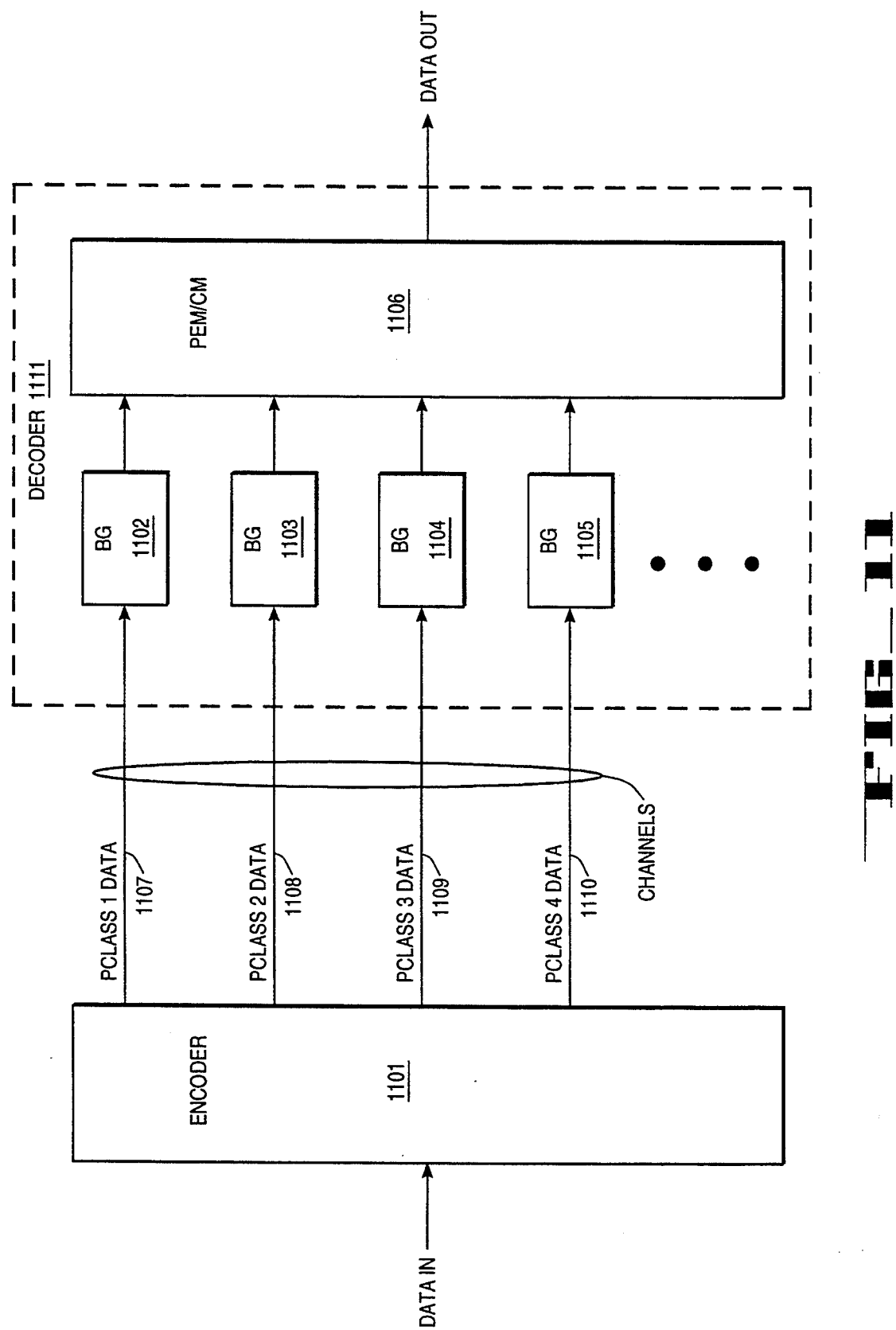
FIG. 11 is a block diagram of a non-interleaved multi-channel parallel architecture.

The present invention provides multi-channel coders to perform parallel decoding of compressed input data. In one embodiment of the multi-channel coders, each bit-stream generator is assigned to one context bin or a group of context bins. To implement the multi-channel coders, a separate channel is provided for each context bin. In this manner, each context bin has a separate channel which is input to a dedicated bit-stream generator and probability estimation module to decode bits of a particular bin. Another embodiment has a separate channel for each probability class (PClass). FIG. 11 is a block diagram of one embodiment of a multi-channel coder system for parallel probability classes according to the present invention.

Referring to FIG. 11, original data is input into encoder 1101. In one embodiment, encoder 1101 receives the data and encodes it into a coded data file. Data decoding is accomplished by decoder 1111. Decoder 1111 comprises bit-stream generators 1102–1105 and combines PEM and CM 1106. When decoding the data, data associated with each of the probability class (PClass) is received by a group of bit-stream generators on separate channels. Coded data corresponding to PClass 1 is sent on channel 1107. Channel 1107 is coupled to one input of bit-stream generator 1102. Coded data corresponding to PClass 2 is sent on channel 1108. Channel 1108 is coupled to one input of bit-stream generator 1103. Coded data corresponding to PClass 3 is sent on channel 1109. Channel 1109 is coupled to one input of bit-stream generator 1104. Coded data corresponding to PClass 4 is sent on channel 1110. Channel 1110 is coupled to one input of bit-stream generator 1105. Note that although only four channels and four dedicated bit-stream generators are shown in FIG. 11, the actual number of channels and dedicated bit-stream generators is application specific and may be more or less than four.

Probability estimation module (PEM)/context model (CM) 1106 is coupled to receive an output from each of bit-stream generators 1102–1105 and, in response, generates the decoded data output. Note that encoder 1101 is included only to depict the entire data path in the compression/decompression system. Decoder 1111 is capable of operating where the data being decoded has been encoded and stored previously, such as in a video display system where graphic images are stored in a memory.

When decoder 1111 decodes the compressed data, PEM/CM 1106 selects the data outputs from bit-stream generators 1102–1105. When PEM/CM 1106 selects one of the bit-stream generators for its decode bits, the data is ready immediately. Thus, PEM/CM 1106 is simply choosing an already decoded result. While PEM/CM 1106 selects one of the bit-stream generators, the other non-selected bit-stream generators are decoding data received on their dedicated channels. Therefore, when PEM/CM 1106 is ready to select the next result, the data is ready (in the proper order).

The proper order is known by PEM/CM 1106 because the order is designed to be causal. PEM/CM 1106 selects the data from the bins in the proper order. For instance, if the data is image data, PEM/CM 1106 accesses the data from each of the bit-stream generators according to the image order (i.e., of the raster scan order). That is, the raster scan supplies the sense of order which PEM/CM 1106 uses.

Independent channels 1107–1110 are constantly supplying new coded data to bit-stream generators 1102–1105 so that bit-stream generators 1102–1105 never starve (i.e., they always have data to decode).

Figure 12:
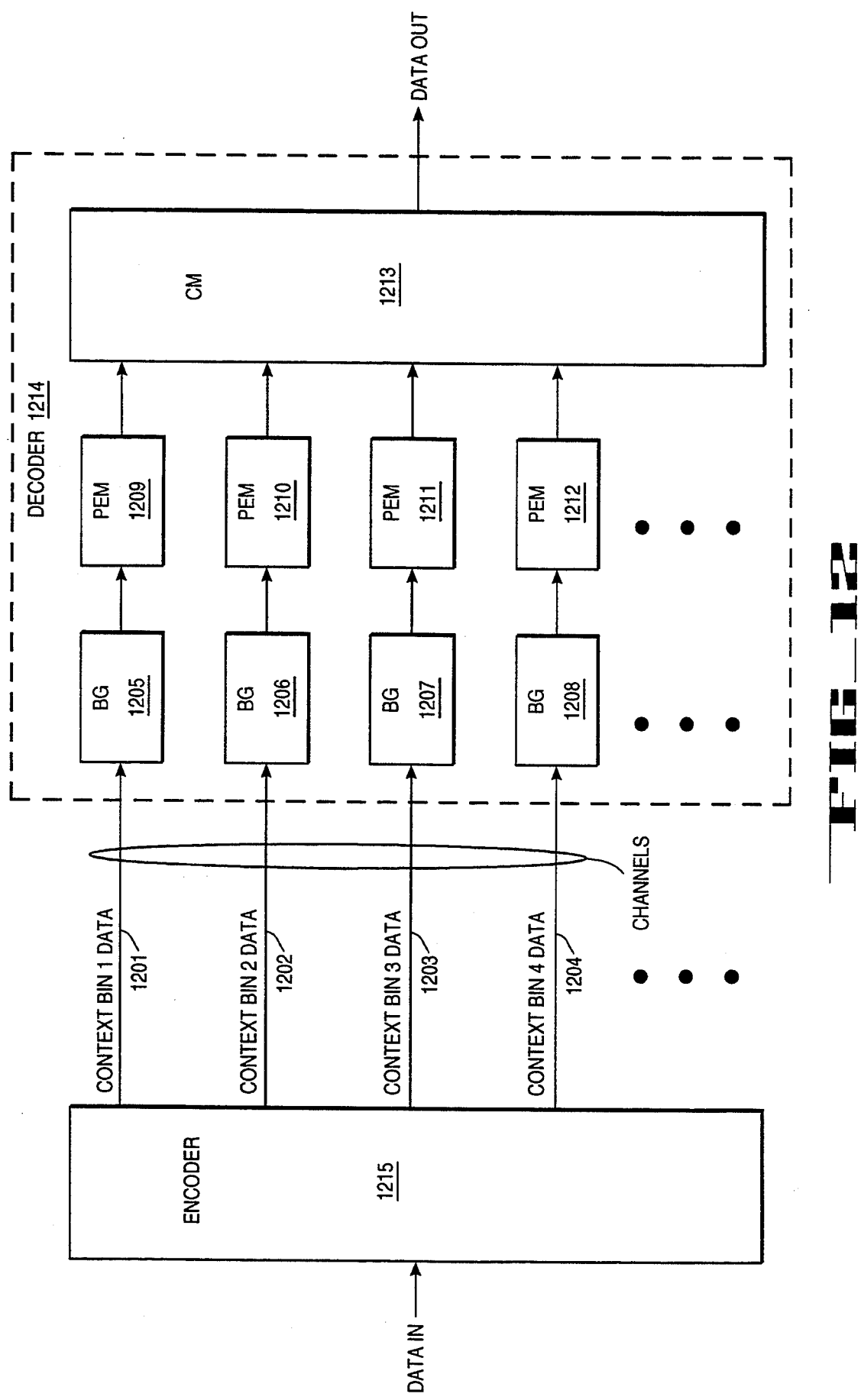
FIG. 12 illustrates a block diagram of a non-interleaved multi-channel parallel decoding architecture.

FIG. 12 shows a block diagram of one embodiment of a multi-channel decoder 1214, for processing context bins in parallel according to the present invention. Referring to FIG. 12, data is input into encoder 1215 which encodes the data. Encoder 1215 is coupled to individual channels 1201–1204. Individual channels 1201–1204 carry coded data corresponding to context bins 1–4, respectively, and are coupled to an input of bit-stream generators 1205–1208 respectively. An output from bit-stream generators 1205–1208 is coupled to an input of probability estimation modules (PEMs) 1209–1212 respectively. The decoded data output from each of PEMs 1209–1212 is coupled to context model 1213, which orders the outputs from all of PEMs 1209–1212. Note that FIG. 12 is only a data flow diagram. Other signals necessary to the operation have not been shown to avoid obscuring the present invention. These signals, and their operation, will become apparent to those skilled in the art.

The operation of decoder 1214 is similar to that of decoder 1111 in FIG. 11, with the exception of PEMs 1209–1212. In decoder 1214, each of PEMs 1209–1212 is dedicated to a different bit-stream generator. For instance, PEM 1209 operates exclusively in conjunction with bit-stream generator 1205. In this case, the probability estimation module, in response to a data request signal from context model 1203, sends an already decoded data bit to context model 1213. Context model 1213 operates casually. While context model 1213 is requesting data for one context, the data associated with other context bins is being decoded, such that data is decoded in parallel. Therefore, parallelism is available in a multi-channel implementation where every bin has a dedicated channel, bit-stream generator and probability estimator.

The cost of the multi-channel coders decode data in parallel is high because the large bandwidth that is required. This bandwidth could be wasted where one bin is used substantially more than the others.

Non-interleaved Channel Coders

The present invention provides a system which uses a single channel to supply multiple bit-stream generators with coded data corresponding to individual context bins (or classes). In order to implement the single channel configuration, a non-interleaved channel is used. Thus, in the present invention, a bit-stream generator can be independent of the context bin (or class) while still using a single channel if a non-interleaved channel coder is used.

Figure 13:
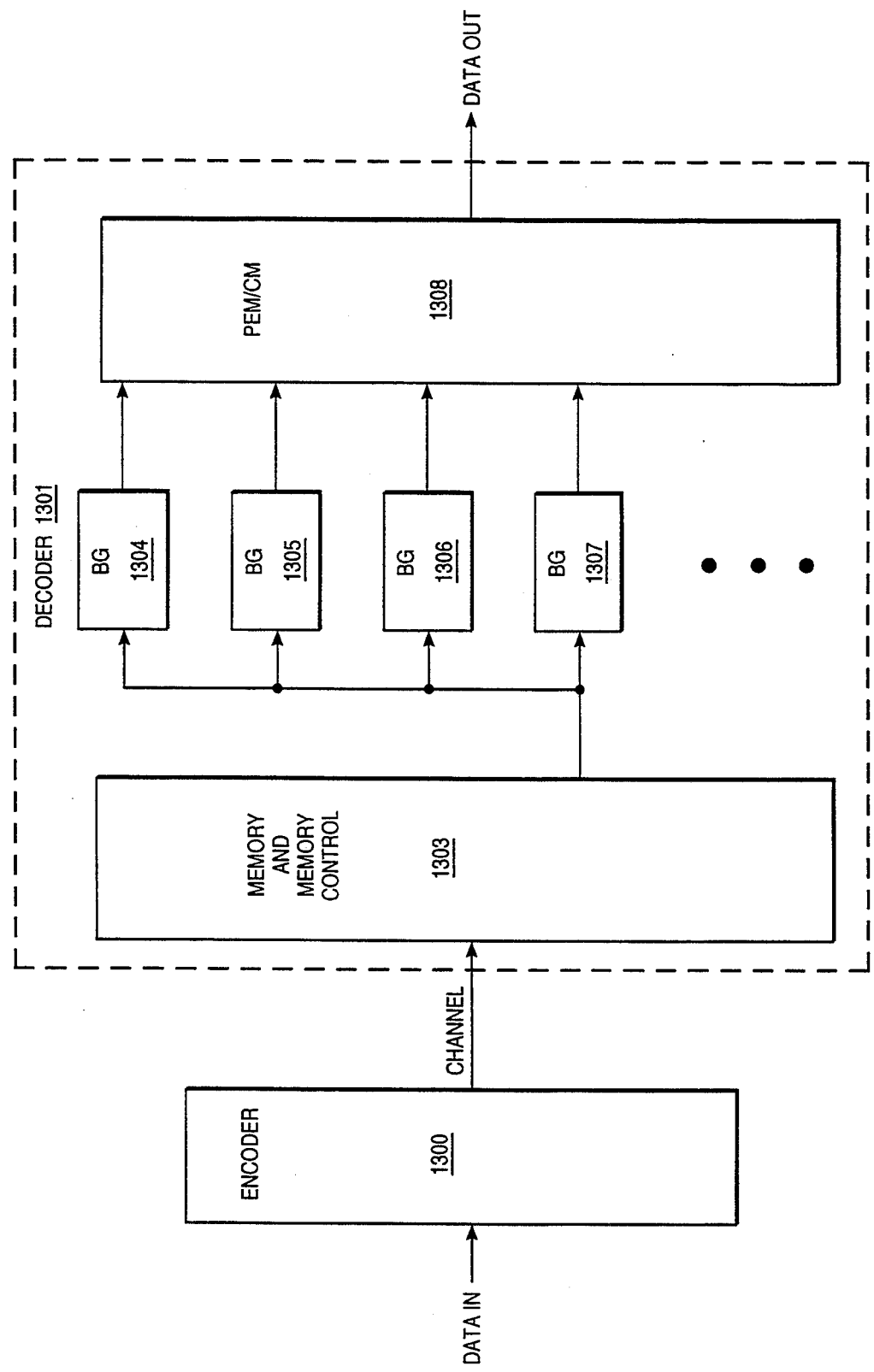
FIG. 13 is a block diagram of a non-interleaved single channel parallel architecture.

FIG. 13 depicts one embodiment of a non-interleaved channel coder for handling probability classes in parallel according to the present invention. Referring to FIG. 13, encoder 1300 receives the original data input and encodes the data. Decoder 1301 receives the coded data and reconstructs the original data. Decoder 1301 comprises memory and memory control 1303, bit-stream generators 1304–1307 and probability estimation module (PEM)/context model (CM) 1308. Memory and memory control 1303 are coupled to receive the coded data streams and outputs data for each probability class (PClass). Bit-stream generators 1304–1307 are coupled to receive the coded data for a distinct probability class from a single port of the memory. An output from each of bit-stream generators 1304–1307 is coupled to PEM/CM 1308.

Bit-stream generators 1304–1307 and PEM/CM 1308 operate in the same manner as the bit-stream generators and PEM/CM of FIG. 11. However, decoder 1301 receives the coded data from a single channel that concatenates the code streams of the different PClasses.

In the currently preferred embodiment, the coded data transmitted in the single channel contains a list of pointers to the data for each PClass (or context bin where processing context bins in parallel) followed by the data for each bin. All of the coded data is received and stored in the memory and memory control 1303. In the currently preferred embodiment, the coded data is stored in sequence. The memory control unit uses the pointers to feed the proper PClass data to its corresponding bit-stream generator.

Functionally, PEM/CM 1308 requests decoded data from one of bit-stream generators 1304–1307. Each of bit-stream generators 1304–1307 requests another codeword from memory control 1303 when it does not have the next codeword PEM/CM 1308 is going to request. If both of these operations occur at the same speed, then only one request of memory 1303 is possible at a time. However, if PEM/CM 1308 operates faster, multiple requests may occur to memory 1303 within the time of one memory access. An arbitration scheme could be used to decide which bit-stream generator is eligible to use memory. Note that in this system, PEM/CM 1308 does not dictate to memory and memory control 1303 its operation—the bit-stream generatom request memory access as needed.

Figure 14:
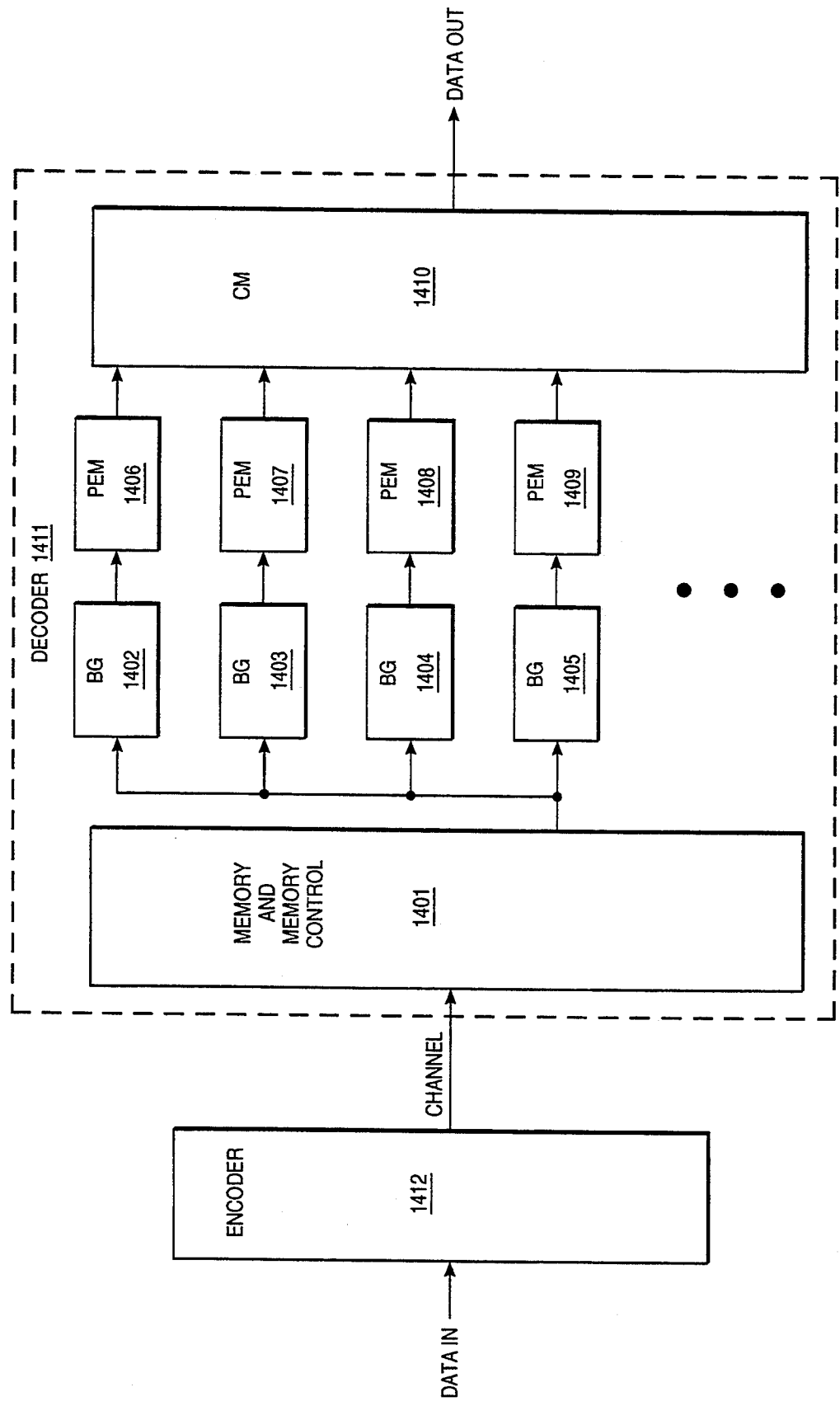
FIG. 14 illustrates a block diagram of a non-interleaved single channel parallel decoding architecture.

FIG. 14 shows a block diagram of one embodiment of the non-interleaved single channel decoder 1411 for processing context bins in parallel. Referring to FIG. 14, the system shown includes encoder 1412, which receives data and produces encoded data, and decoder 1411 which receives coded data from the channel. Decoder 1411 comprises memory and memory control 1401, bit-stream generators 1402–1405, probability estimation modules 1406–1409, and context model 1410. Bit-stream generators 1402–1405, probability estimation module 1406–1409 and context model 1410 are coupled and operate in the same manner as the bit-stream generators, the probability estimation modules and the context model described in conjunction with FIG. 12. Memory and memory control 1401 is coupled to bit-stream generators 1402–1405 and the coded input data and operates in the same manner as the memory and memory control described in conjunction with FIG. 13. To reiterate, each context bin has a dedicated channel, bit-stream generator and probability estimator.

Figure 15:
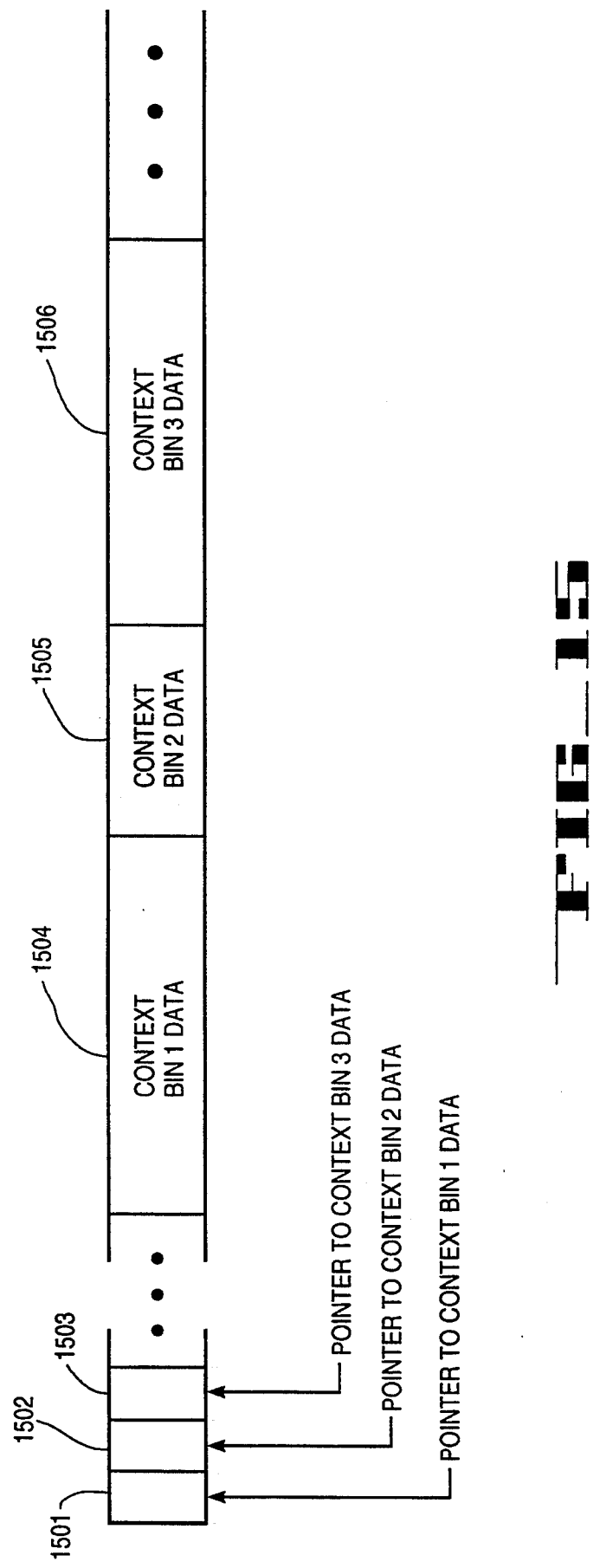
FIG. 15 is an example of a concatenated code stream used in the present invention.

FIG. 15 illustrates an example of a concatenated code stream containing the data for all the bins. The concatenating code stream for the single channel includes a header and coded data for each context bin. The header includes the pointers to the start of the coded data for each context bin in the code stream. For instance, coded data 1501 in the code stream corresponds to the pointer to context bin 1 coded data. Coded data 1502 in the code stream corresponds to the pointer to context bin 2 data. Data 1503 in the code stream corresponds to the pointer to context bin 3 coded data. In the currently preferred embodiment, the coded data for each context bin is stored in sequence in the code stream. For instance, in FIG. 15, context bin 1 coded data 1504 follows the pointers portion of the concatenated code stream. Next, context bin 2 data 1505 follows in the code stream, followed by context bin 3 coded data, etc. Note that the amount of coded data in each of coded data sections 1504–1506 may be different.

Referring back to FIG. 13, when decoder 1301 has received all of the compressed data from the single channel into memory 1303, the starting locations for each of the data may be identified and the data sent to the proper bit-stream generator as requested by that bit-stream generator.

The encoder in the present invention must generate a data stream in the format required by decoder 1308. One method to accomplish this is through the use of a computer which encodes data for each context bin and stores the coded data for context bin each into a separate file. After the encoding of the separate context bin coded data is complete, the length of each file is determined. The length information is converted into the proper format for pointers and is placed into the channel. Each file of the encoded data is then put in the channel in sequence.

Since non-interleaved channel coders use many bit-stream generators, using a code that allows small hardware cost bit-stream generators is an advantage. In one embodiment, a non-interleaved channel coder is implemented using R-coders as shown in FIG. 6. It should be noted that the non-interleaved channel of the present invention could be implemented with many different codes. Also note that the coders can be different in the same implementation.

Assuming context model 1308 is no faster than memory 1303 can be accessed, decoder 1301 can operate in a pipelined manner, decoding data in parallel. While coded data is being obtained by a bit-stream generator, the run length of other coded data is being decoded and the LPS determined and the selection of still other decoded data by context model 1308, all simultaneously. In one embodiment, a bit is output every memory cycle time.

Figure 16:
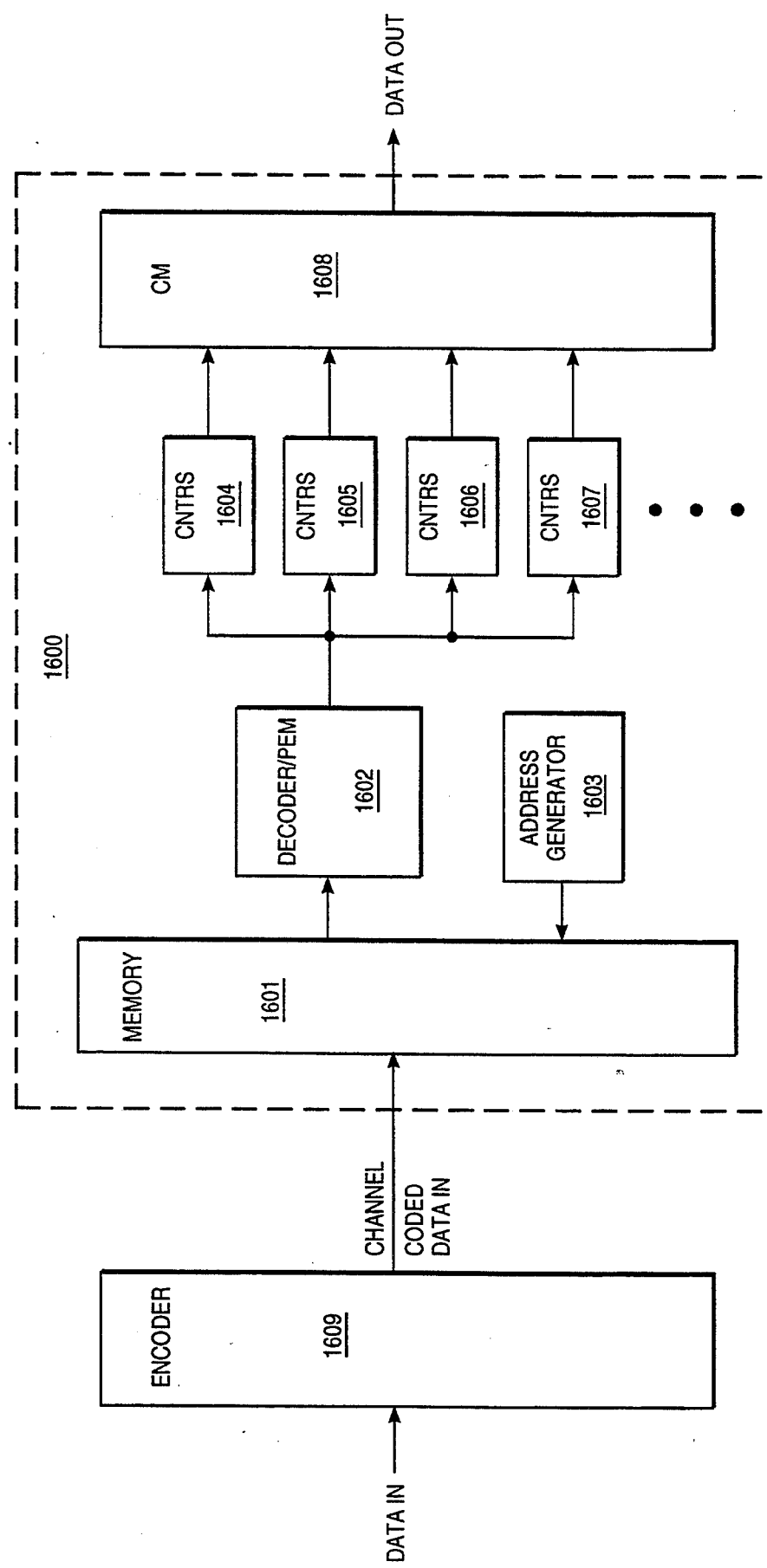
FIG. 16 illustrates a block diagram of a non-interleaved single channel parallel decoding architecture which uses an R-coder.

FIG. 16 illustrates a block diagram of one embodiment of a non-interleaved single channel parallel decoding architecture using the R-coders of the present invention. Referring to FIG. 16, encoder 1609 is coupled to receive data and encodes the data. Coded data is received from the channel to decoder 1600. Channel decoder 1600 comprises memory 1601, decoder 1602, address generator 1603, counters 1604–1607 and context model 1608. Memory 1601 is coupled to receive the coded data from the channel and addresses from address generator 1603. Memory 1601 stores the coded data and outputs it to decoder 1602. Decoder 1602 is coupled to receive the coded data from memory 1601. Decoder 1206 outputs the count to one of the designated counters 1604–1607. Counters 1604–1607 are coupled to receive the output of decoder 1602 and output the count data to context model 1608. Context model 1608 is coupled to counters 1604–1607 and outputs the decoded data. Note that although only four counters are shown, the actual number of counters could be larger or smaller depending on the number of context bins.

Note that the only a portion of decoder 1600 that requires replicated parallel operation is the counter portion. The remainder of decoder 1600 (i.e., shifter, R-code decoder, and probability estimation module) can be shared among all the counters and can access the single memory 1601.

Memory 1601 is coupled to decoder 1602 and supplies decoder 1602 with data. The number of lines coupling memory 1601 and decoder 1602 is equal to or greater than the number of bits in the largest codeword. In other words, the memory width is at least the maximum number of bits in the run length codeword. Note that multiple bit-stream generators are not needed if decoder 1602 operates as fast as the memory bandwidth and the probability estimation module. Even so, multiple counters (e.g., counters 1604–1607) are utilized because they feed context model 1608.

Counters 1604-1607 can provide decoded data as long as counts are available. In the present invention, counters 1604–1607 are not starved so that decoded data is always available to context model 1608. The entire decoder 1600 can be pipelined as long as the memory addresses that are generated by address generator 1603 are known. Once a counter is selected by context model 1608, its count could be used up. Context model 1608 could select a counter three times in a row, causing the counter to select decoder 1602 three consecutive times. In the currently preferred embodiment, context model 1608 only requests once a cycle, the decoding operation occurs only once a cycle, and memory accesses occur only once a cycle. Hence, if the coder of the present invention has a backlog of counts in a FIFO, (i.e., every counter has at least two counts), context model 1608 is never starved.

To ensure that context model 1608 is not starved, the present invention starts by decoding several run lengths, perhaps three for every counter in the decoder. Because of this, memory address generator 1603 is able to start obtaining data for the pipeline. After this is complete, context model 1608 starts selecting counters, since by this time some run counts are available. By the time the initial counts are used up, more counts have been decoded. In this manner, context model 1608 is never starved.

Since the context model requests once a cycle, the last context access could be allowed to access memory 1601 and decoder 1602. If one or two latches are used as a small first-in/first-out (FIFO) to buffer the input to the counters, the memory access and the decoding could be pipelined so that speed is not limited.

The use of parallelism in the non-interleaved channel decoder reduces the overhead in the bit-stream generator pipeline stage so that the overall system speed is not limited. In comparison, in a system that does not use parallel counters, one memory word is required for each bin to store the current count. The time to read-modify-write the count due to limited memory speeds would negatively impact the speed of the entire system.

Overall system speed is limited by the context model and/or the access time of the memory for storing the encoded data. To fully utilize the parallelism to increase system speed, at least the context model and possibly the entire decoder must be made to function in parallel. However, the parallelism in the bit-stream generator (and PEM) described here can allow coders to be built that are faster than the current state-of-the-art.

Interleaved Parallel Decoding System

The present invention also provides an interleaved decoding system for decoding compressed data in parallel. The data is segmented into independent streams by context bin, context class or probability class and then coded as before. These streams can be delivered to the decoder in probability class in parallel (as in the previously described multi-channel coders) or as a complete concatenated file (as in the non-interleave channel coders). But note that the parallel decoder requires data from these streams in a serial and deterministic order. Although the order that the decoder needs coded data in is nontrivial, it is not random. By ordering the codewords in this order at the encoder instead of the decoder, as with the other methods, the coded data can be interleaved into a single stream.

Note that if this interleaved ordering is performed with the variable length codewords, the codestream must be input to a single shifter that shifts the right number of bits out to the decoders. This would require a feedback loop that would be slow. To avoid this, the codewords of each coded data stream (for each context bin, for example) are packed into fixed length words. Thus, each decoder receives the entire fixed length word from the single coded data stream. The variable length codewords are shifted out at each decoder and, thus, decoding is performed in parallel.

Figure 17:
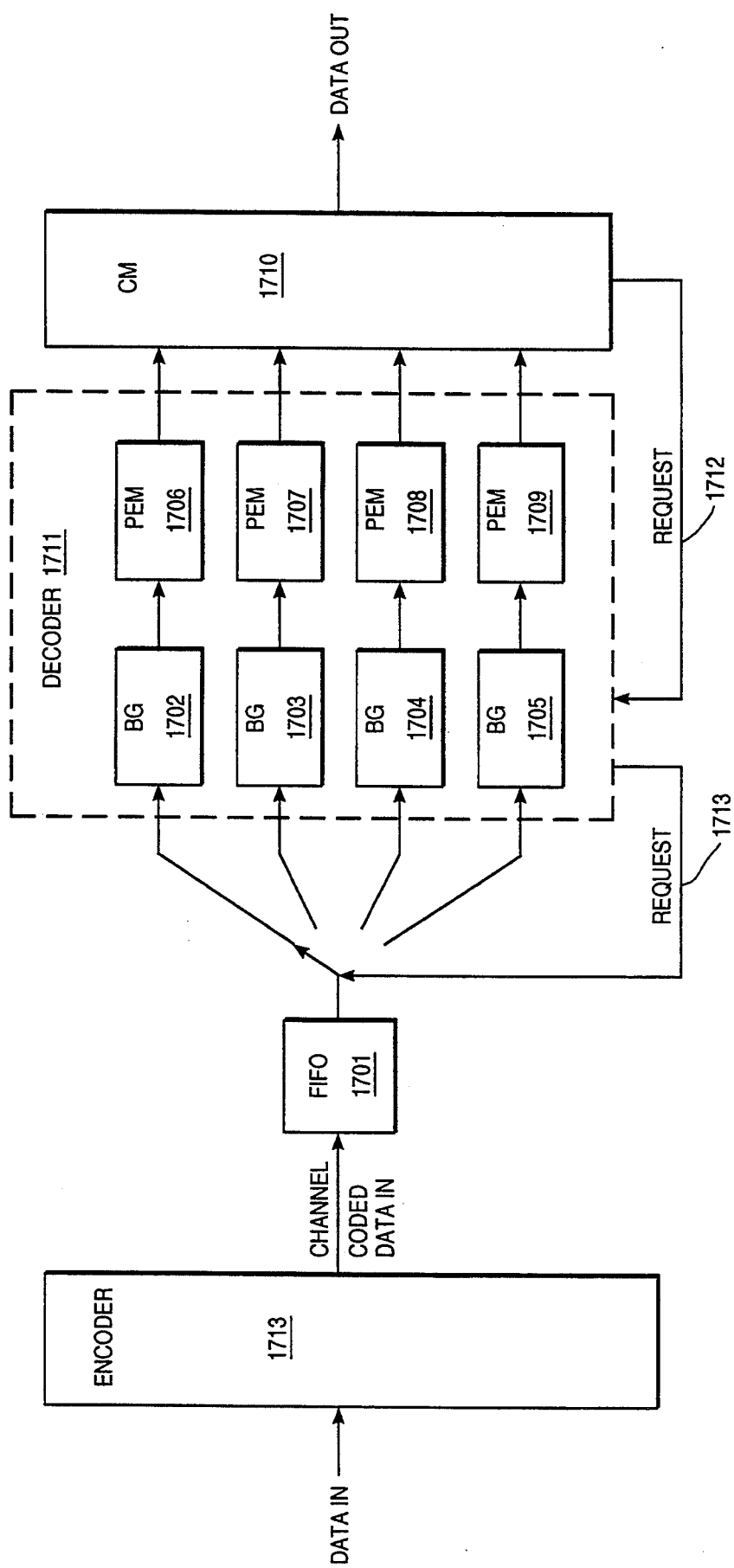
FIG. 17 illustrates a block diagram of one embodiment of an interleaved parallel decoding system that processes context bins according to the present invention.

An interleaved parallel architecture is shown in FIG. 17. Referring to FIG. 17, the interleaved parallel architecture includes encoder 1713, which receives data and generates coded data, FIFO 1701, decoder 1711 and context model 1710.The input of FIFO 1701 is coupled to the encoded input data. The output of FIFO 1701 is coupled to bit-stream generators 1702–1705 of decoder 1711. Bit-stream generators 1702–1705 are coupled to probability estimation modules (PEM) 1706–1709, respectively. Each of PEMs 1706–1709 is coupled to context model 1710, which produces the decoded output data. A request signal 1712 is output from context model 1710 to decoder 1711. A request signal 1713 is also output from decoder 1711 and coupled to FIFO 1701 to request more encoded data.

Coded data is buffered in FIFO 1701. In the present invention, FIFO 1701 may be any size. In the currently preferred embodiment, FIFO 1701 is smaller than the entire coded file. The output of FIFO 1701 is routed to a decoder comprised of a bit-stream generator and a probability estimation machine. FIFO 1701 is requested to send data by request signal 1713. However, FIFO 1701 does not have knowledge ahead of time as to which bit-stream generator requested the data - data is simply provided to the bit-stream generator that makes the request. Context model 1710 requests decoded data from bit-stream generators 1702–1705, via PEMs 1706–1709 respectively in a known order. This causes bit-stream generators 1702–1705 to request coded data in a deterministic order.

Note that if CM 1710 operates faster than FIFO 1701 supplies data, FIFO 1701 would have to be able to accommodate multiple (i.e., parallel) requests to supply data to the bit-stream generators. To handle parallel requests, FIFO 1701 would be required to accept multiple requests and to keep track of the source of the requests to ensure that the proper requested data is sent to the correct bit-stream generator.

In the currently preferred embodiment, context model 1710 operates faster than FIFO 1701. If the FIFO is empty, the entire decoder and context model stop until more input data arrives.

Figure 18:
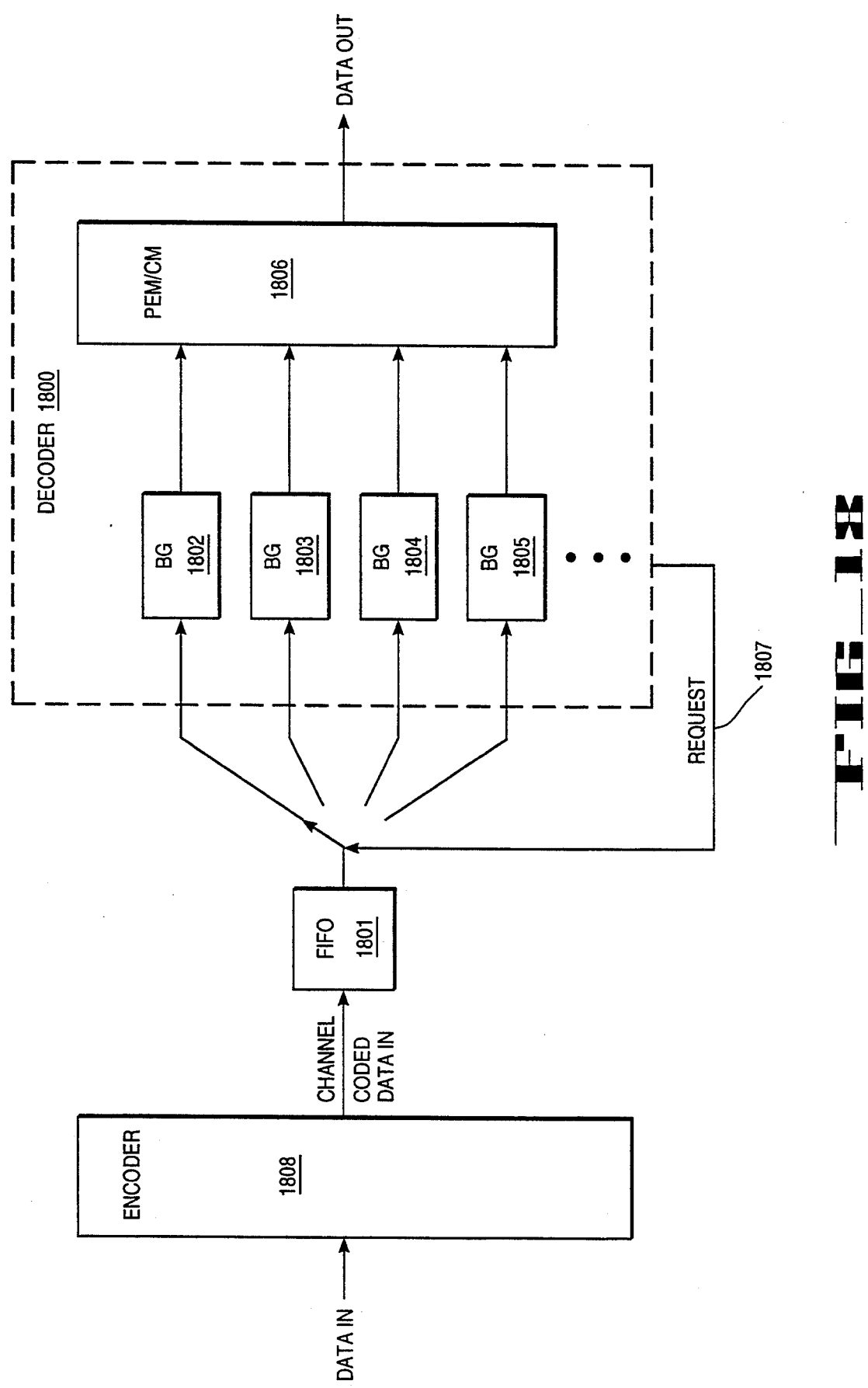
FIG. 18 illustrates a block diagram of one embodiment of an interleaved parallel decoding system that processes probability classes according to the present invention.

FIG. 18 is a block diagram of an interleaved parallel architecture which handles probability classes in parallel. Referring to FIG. 18, the interleaved parallel architecture comprises encoder 1808, which receives data and encodes the data, FIFO 1801 and decoder 1800. Decoder 1800 comprises bit-stream generators 1802–1805 and probability estimation module (PEM)-/context model (CM) 1806. The input of FIFO 1801 is coupled to the encoded input data. The output of FIFO 1801 is coupled to bit-stream generators 1802–1805 of decoder 1800. Bit-stream generators 1802–1805 are coupled to PEM/CM 1806, which produces the decoded output data. A request signal 1807 is output from decoder 1800 and coupled to FIFO 1801 to request more encoded data. Note that the actual number of bit-stream generators may vary.

Coded data is buffered by FIFO 1801 and supplied to bit-stream generators 1802–1805 in response to request signal 1807 in the same manner as FIFO 1701 in FIG. 17. Bit-stream generators 1802–1805 decode the coded data. PEM/CM 1806 requests decoded data from bit-stream generators 1802–1805 in a known order according to probability class, so that bit-stream generators 1802–1805 request data in a deterministic order. PEM/CM 1806 operates in the same manner as the PEM/CM of FIG. 13.

Figure 19:
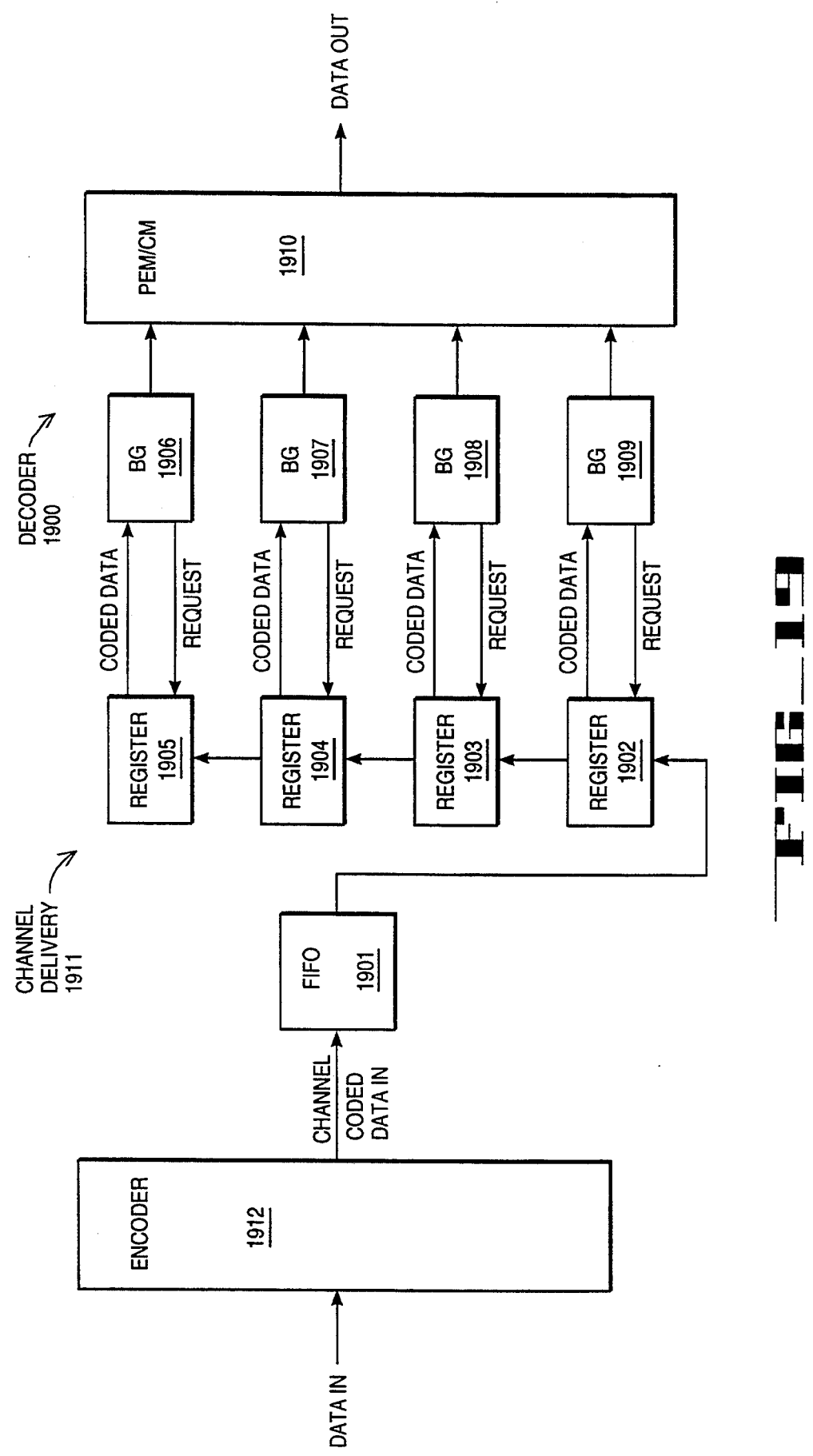
FIG. 19 illustrates a block diagram of an interleaved parallel decoding system that supports multiple requests simultaneously.

In order to take advantages of the speed with which the context model may operate, as opposed to the FIFO, a series of registers may be used to supply data to the bit-stream generators. One embodiment of such a scheme is depicted in FIG. 19. Referring to FIG. 19, encoder 1912 is shown receiving data and encoding the data. The coded data is received by channel delivery 1911. FIFO 1901 is shown coupled to receive the coded data input. FIFO 1901 is controlled by control logic (not shown). FIFO 1901 supplies coded data to registers 1902–1905 which are coupled in series. The coded data from FIFO 1901 is coupled to one input of register 1902. Register 1902 is output to both register 1903 and bit-stream generator 1909. Register 1903 is coupled to receive the coded data output from register 1902 and outputs coded data to register 1904 and bit-stream generator 1908. Register 1904 is coupled to receive the coded data from register 1903 and outputs coded data to register 1905 and bit-stream generator 1907. Register 1905 outputs coded data to bit-stream generator 1906. Bit-stream generators 1906–1909 are coupled to probability estimation module (PEM)/context model (CM) 1910, which outputs decoded data. Each of bit-stream generators 1906–1909 are also coupled to registers 1905–1902 respectively. That is, each of registers 1902–1905 supplies coded data to its bit-stream generator in response to a request signal from the bit-stream generator. Note that bit-stream generators 1906–1909 and PEM/CM 1910 operate in the same manner as some components in FIG. 17.

FIFO 1901 supplies coded data to bit-stream generators 1906–1909 via registers 1902–1905 respectively. However, registers 1902–1905 are coupled serially, thereby being supplied data in order from register 1902 to register 1905. As the coded data in a particular register is used, coded data from a register lower in the chain provides more coded data. Where the context model is able to request decoded data faster than the FIFO can supply data, it is possible that multiple bit-stream generators may request data during the same memory access cycle. The register scheme shown in FIG. 19 allows multiple requests for coded data to be served simultaneously. For instance, when the data in both registers 1904 and 1905 is used up, the coded data in registers 1903 and 1902 would be shifted up (upon request) and would be the next coded data to be decoded by bit-stream generators 1906 and 1907. Also, new data would be received into registers 1903 and 1902 from FIFO 1901.

Note that under such an arrangement, there is a deterministic order to the coded data in that the coded data must be shifted into the register associated with the correct bit-stream generator. Thus, the coded data is ordered according to the order in which coded data will be used, such that after each request for more data, all of the registers 1902-1905 contain coded data. With this type of arrangement, it is possible for N accesses to occur simultaneously every Nth cycle. For instance, two bit-stream generators may access at the same time every other cycle, while four bit-stream generators may access at the same time every fourth cycle.

The additional control associated with such an interleaved system is the control which determines which bit-stream generator requested more coded data, determines the amount to shift, and determines where to stop shifting, such that after each memory (i.e., FIFO) access, each register of register 1902-1905 contains data. Note also that each of registers 1902-1905 could be a FIFO itself. In this case, additional control circuitry would be required.

Encoding for an interleaved System

The main difference between the encoder and the decoder is that while counting a run of data the encoder must wait until the end of the run to emit the proper code. The decoder needs the codeword at the beginning of the run before it can decode and emit a valid bit. This skew between the needs of the decoder and the capability of the encoder is not a problem unless there is more than one context bin. With multiple context bins, the data stream is divided into many context bin data streams. Each stream is encoding data at different rates. When this is combined into a single stream, this skew must somehow be corrected at the encoder. For example, if one context bin encoder encounters a bit that begins a very long run, the codeword that this run eventually produces is the next code that the decoder will need. However, before that run in that context bin is over, many other codewords could be produced by other context bin coders. These other codewords must be stored by the encoder until the first context bin run is over and the coder emits a codeword.

A problem arises in that the amount of memory needed to store the codewords that are created by other coders is unknown. Thus, the system is limited by memory. In non real-time software implementations, the computer memory is usually large and this is often not a problem. The memory storage is shown as a buffer combined with bit packing in FIG. 20. Note that this could be done with just one buffer or other memory configuration.

Remember, variable length codewords for each context bin are packed into a constant word size. Otherwise, the decoder will necessarily have a feedback loop to determine the codeword length, defeating the purpose of parallel architecture. Another problem is creating a state machine to determine the correct order. Determining the order in which to encode the data is complicated and there are numerous methods. One way to determine this order is to have a copy of the decoder (a "snooper" decoder) in the encoder. This "snooper" decoder decodes the data just after encoding. Thus, the request for codewords from this "snooping" decoder are exactly the same as the real decoder at the other end of the channel.

In the present invention, the encoder encodes all the data and the context bins are bit packed. Then a decoder requests codewords in a certain order and that order is used to correctly generate the coded data stream.

Figure 20:
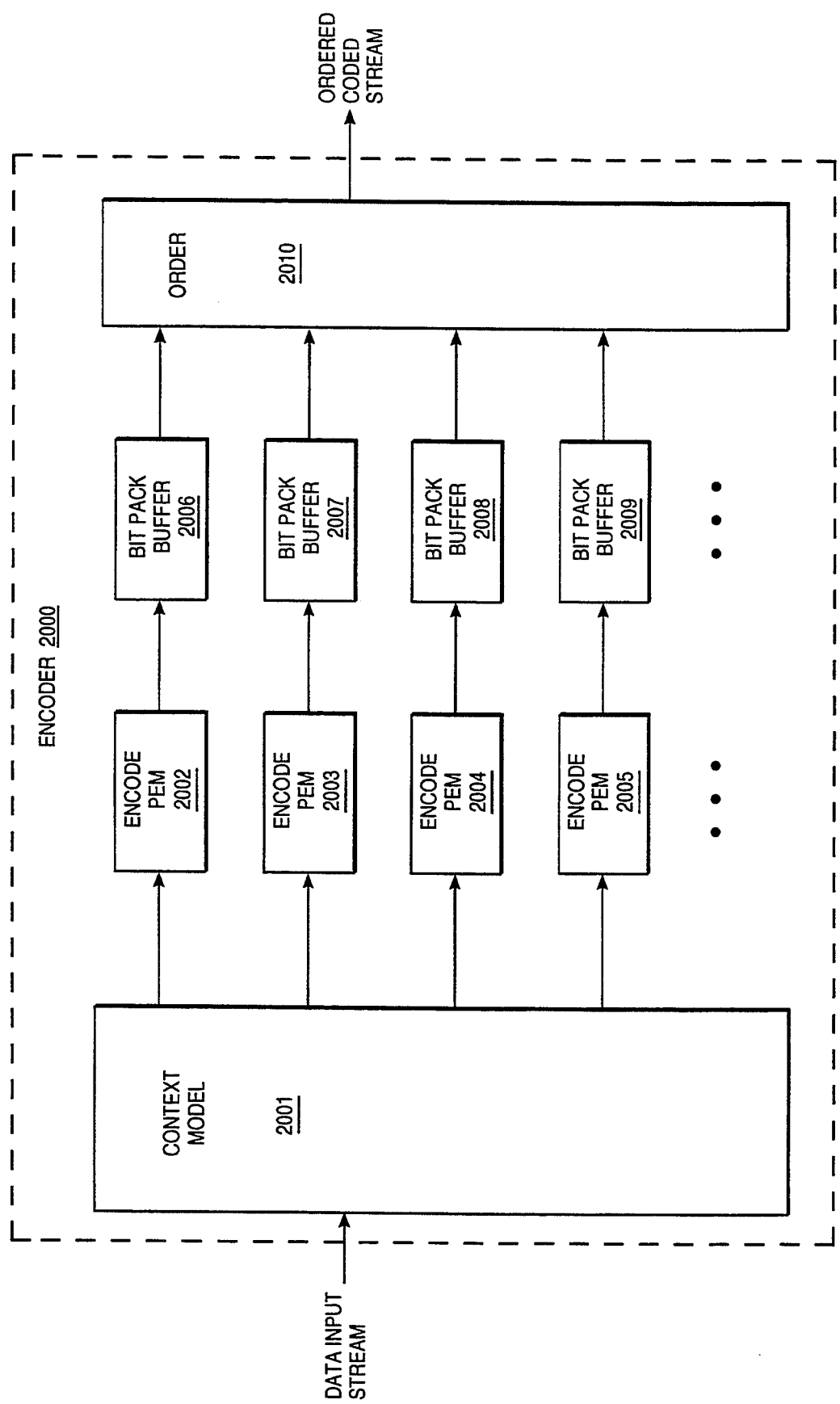
FIG. 20 is a block diagram of one embodiment of the parallel encoding architecture of the present invention.

Considering again FIG. 13, the encoder block is not detailed. The encoder arranges the original data into context bins, encodes each bin and orders the output in the proper order. One embodiment of the encoder of the present invention is shown in FIG. 20. Although the encoding is currently performed in software in a non real-time, serial stream, memory intensive manner, the same block diagram could be described in hardware implementation.

Referring to FIG. 20, encoder 2000 comprises context model 2001, encode/probability estimation modules 2002-2005, bit pack buffers 2006-2009 and order block 2010. Context model 2001 is coupled to receive a data input stream and outputs data according to context bins to encode/probability estimation modules 2002-2005. Each of encode/probability estimation modules 2002-2005 is coupled to receive a separate context data stream and encodes the data. The outputs of encode/probability estimation modules 2002-2005 are coupled to bit pack buffers 2006-2009 respectively, which stores the encoded data. The outputs of bit pack buffers 2006-2009 are coupled to order block 2010, which outputs the ordered compressed code stream.

FIG. 21 shows a block diagram of the snooping decoder of the present invention which implements the order block shown in FIG. 20. Referring to FIG. 21, snooper decoder 2100 is shown coupled to bit pack buffers 2101-2103. Although only three bit pack buffers are shown, the present invention may utilize more or less bit pack buffers. Bit pack buffers 2101-2103 output encoded data to snooper decoder 2100.

In the currently preferred embodiment, snooper decoder 2100 comprises decoder data request arbitrator 2104, decoders 2105-2107, and context model 2108. Note that although only three decoders are shown, any variable number of decoders may be employed. The outputs from bit pack buffers 2101-2103 are coupled to decoder data request arbitrator 2104. Decoders 2105-2107 are coupled to and request data from arbitrator 2104. The data requested is also output from arbitrator 2104 as the ordered compressed code stream. Decoder 2105-2107 are coupled to context model 2108, which indicates to decoder 2105-2107 which data to request. Context model 2108 outputs unused decoded data.

The context model 2108 requests the data from decoders 2105-2107 which causes data to be received from the bit-pack buffers. Arbitration 2104 arbitrates dual requests and outputs data as the ordered compressed data when data is sent to one of decoders 2105-2107. Note that snooper decoder 2100 includes arbitration 2104 to decide which of decoders 2105-2106 is to receive data first when more than one could be exhausted at once (parallel output from the context model). Also note that the context model reintegrates the context streams back into the original data stream and, therefore, determines the order.

For a duplex system, such as a facsimile machine, a decoder is a necessary part of the system anyway so that the snooper decoder function requires little or no extra hardware.

Another embodiment of the encoder of the present invention is shown in FIG. 22. Referring to FIG. 22, encoder 2200 comprises context model (CM)/probability estimation module (PEM) 2201, bit pack buffers 2202–2205 and order generator 2206. CM/PEM 2201 is coupled to receive a data input stream and outputs data according to probability class (PClass) to bit pack buffers 2202–2205 which stores the encoded data. Bit pack buffers 2202–2205 stores the encoded data and outputs the data to order generator 2206 in response to its request. Order generator 2206 is coupled to receive the data from bit pack buffers 2202–2206 and outputs the ordered compressed code stream.

System Applications

One virtue of any compression system is the reduce storage requirements for a set of data. The parallel system of the present invention may be substituted for any application currently fulfilled by a lossless binary coding system. These include facsimile compression, database compression, compression of bitmap graphic images, and compression of transform coefficients in image compression standards such as JPEG and MPEG. The present invention allows small efficient hardware implementation and relatively fast software implementations making it a good choice even for applications that do not require high speed.

The real virtue that the present invention has over the prior art is the possibility of operation at very high speeds, especially for decoding. In this manner, the present invention can make full use of expensive high speed channels, such as high speed computer networks, satellite and terrestrial broadcast channels. FIG. 23 illustrates such a system, wherein broadcast data or a high speed computer network supplies data to decoding system 2301 which decodes the data in parallel to produce output data. Current hardware entropy (such as the Q-Coder) would slow the throughput of these systems. All of these systems are designed, at great cost, to have high bandwidth. It is counter productive to have a decoder slow the throughput. The parallel system of the present invention not only accommodates with these high bandwidths, it actually increases the effective bandwidth because the data can be transmitted in a compressed form.

The parallel system of the present invention is also applicable to obtaining more effective bandwidth out of moderately fast channels like ISDN, CD-ROM, and SCSI. Such a bandwidth matching system is shown in FIG. 24, whereas data from sources, such as a CD-ROM, Ethernet, Small Computer Standard Interface (SCSI), or other similar source, is coupled to decoding system 2401, which receives and decodes to the data to produce an output. These channels are still faster than some current coders. Often these channels are used to service a data source that requires more bandwidth than the channel has, such as real-time video or computer based multimedia. The system of the present invention can perform the role of bandwidth matching.

The system of the present invention is an excellent choice for an entropy coder part of a real-time video system like the nascent High Definition Television (HDTV) and the MPEG video standards. Such a system is shown in FIG. 25. Referring to FIG. 25, the real-time video system includes decoding system 2501 which is coupled to compressed image data. System 2501 decodes the data and outputs it to lossy decoder 2502. Lossy decoder 2502 could be the transform, color conversion and subsampling portion of an HDTV or MPEG decoder. Monitor 2503 may be a television or video monitor.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

Thus, a method and apparatus for parallel decoding and encoding of data has been described.

We claim:

1. A system for decompressing a data stream of a plurality of codewords comprising:
    channel means for receiving the plurality of codeword of the data stream; and
    decoding means coupled to said channel means for decoding each codeword in the data stream according to its context and a probability estimate, wherein codewords of different contexts in the data stream are decoded at the same time, such that the data stream is decoded in parallel.

2. The system as defined in claim 1 wherein the channel means comprises a plurality of channels of data.

3. A system for decompressing a data stream of a plurality of codewords comprising:
    channel means for receiving the plurality of codewords of the data stream: and
    decoding means coupled to said channel means or decoding each codeword in the data stream according to its context and a probability estimate, wherein codewords of different probability estimates in the data stream are decoded at the same time, such that the data stream is decoded in parallel.

4. The system defined in claim 3 wherein the channel means and the decoding means operate in a pipelined manner.

5. The system as defined in claim 1 or 3 wherein the channel means provides at least two data streams in parallel.

6. The system as defined in claim 5 wherein the channel means comprises a single non-interleaved channel.

7. The system as defined in claim 5 wherein the channel means comprises a single interleaved channel.

8. The system as defined in claim 1 wherein the codewords in the data stream comprise image data, such that the decoding means decodes image data in parallel.

9. The system as defined in claim 1 further comprising encoding means for receiving a data stream and encoding the data stream into a plurality of codewords.

10. The system defined in claim 1 wherein the channel means and the decoding means operate in a pipelined manner.

11. A system or decompressing a data stream of a plurality of codewords comprising:
- a channel control mechanism coupled to receive the plurality of codewords of the data stream;
- a plurality of decoders coupled to said channel control mechanism to receive and decode each codeword in the data stream according to its context, wherein codewords in the data stream of different contexts are decoded at the same time, such that decoded data bits from codewords of different contexts are output in parallel;
- data storage coupled to the plurality of decoders to store the decoded data; and
- modeling mechanism coupled to the data storage to select the decoded data from the data storage, such that the decoded data is output in its original order.

12. The system as defined in claim 11 wherein at least one of the plurality of decoders decodes data corresponding to a class of context bins.

13. A system for decompressing a data stream of a plurality of codewords comprising:
- a channel control mechanism coupled to receive the plurality of codewords of the data stream;
- a plurality of decoders coupled to said channel control mechanism to receive and decode each codeword in the data stream according to its probability class, wherein codewords in the data stream of different probability classed are decoded at the same time, such that decoded data bits from codewords of different probability classes are output in parallel;
- data storage coupled to the plurality of decoders to store the decoded data; and
- modeling mechanism coupled to the data storage to select the decoded data from the data storage, such that the decoded data is output in its original order.

14. A system for decompressing a data stream of a plurality of codewords coded according to a coding scheme, said system comprising:
- channel control means for receiving the plurality of codewords of the data stream, wherein the channel control means includes means for partitioning the plurality of codewords into a plurality of parallel data streams based on one of a set of attributes of the coding scheme and means for supplying the plurality of parallel data streams;
- plurality of bit-stream generators, each coupled to a distinct one of the plurality of parallel data streams, wherein each of the plurality of bit-stream generators decodes codewords of the plurality of parallel data streams and further wherein at least two of the plurality of bit-stream generators decode codewords at the same time, such that codewords in the data stream partitioned into different parallel data streams based on the coding scheme are decoded in parallel to produce decoded data;
- modeling means coupled to the plurality of bit-stream generators for selecting the decoded data from the bit-stream generators to output the decoded data in a deterministic order.

15. The system defined in claim 14 wherein the channel control means, plurality of bit stream generators and the modeling means operate in a pipelined manner.

16. The system as defined in claim 14 further comprising a plurality of probability estimation mechanisms, each coupled to the modeling means and one of the plurality of bit-stream generators to provide probability estimates to the plurality of bit-stream generators, wherein each one of the plurality of bit stream generators is associated with at least one context bin distinct from context bins of bit stream generators other than said each one of the plurality of bit stream generators, such that codewords of different context bins are decoded in parallel according to the probability estimates received from the plurality of probability estimation mechanisms, wherein the modeling means selects each of the plurality of probability estimation mechanisms in the deterministic order to output the decoded data from the plurality of bit stream generators.

17. The system as defined in claim 14 further comprising a probability estimation mechanisms coupled to the modeling means and each of the plurality of bit-stream generators to provide probability estimates to the plurality of bit-stream generators, wherein each one of the plurality of bit stream generators is associated with at least one probability class distinct from probability classes of bit stream generators other than said each one of the plurality of bit stream generators, such that codewords of different probability classes are decoded in parallel according to the probability estimates received from the probability estimation mechanisms, wherein the modeling means selects the decoded data from the plurality of bit-stream generators by providing contexts in the deterministic order to the probability estimation mechanisms, such that the probability estimation mechanisms selects decoded data from the plurality of bit stream generators.

18. The system as defined in claim 14 wherein the channel control means comprises:
- a memory means for storing the data stream; and
- at least one channel coupled to the memory means and the plurality of bit-stream generators for providing a data streams corresponding to at least one distinct context bin to each of the plurality of bit stream generators.

19. The system as defined in claim 14 wherein the channel control means comprises:
- a memory means for storing the data stream; and
- at least one channel coupled to the memory means and the plurality of bit-stream generators for providing a data streams corresponding to at least one probability class to each of the plurality of bit stream generators.

20. The system as defined in claim 14 wherein the channel control means comprises:
- a memory means for receiving the data stream;
- a plurality of channels, each coupled to one of the plurality of bit stream generators, each for carrying data to said one of the plurality of bit stream generatom; and
- means for directing data in the data stream from the memory means to the plurality of channels.

21. The system as defined in claim 14 wherein the data stream comprises a plurality of code streams concatenated into a concatenated code stream and the channel control means includes means to direct the proper portion of the concatenated code stream to the proper one of the plurality of bit-stream generators.

22. The system as defined in claim 21 wherein the concatenated code stream includes the data for each context bin and a plurality of pointers to indicate the location of the data for each context bin in the concatenated code stream.

23. The system as defined in claim 21 wherein the concatenated code stream includes the data for each probability class and a plurality of pointers to indicate the location of the data for each probability class in the concatenated code stream.

24. The system as defined in claim 14 wherein the channel control means includes means for directing the codewords in the data stream to the proper bit stream generation means.

25. The system as defined in claim 14 wherein the channel control means includes a FIFO.

26. The system as defined in claim 14 wherein the channel control means comprises:
   a memory means for receiving the data stream and outputting the data stream in a predetermined order;
   a plurality of register means coupled serially to the data stream from the memory means and each coupled to one of the plurality of bit-stream generators for supplying at least one codeword of the data stream to its associated one of the plurality of bit-stream generators, wherein the data stream is ordered, such that as codewords are used by at least two bit-stream generators, multiple request for data can be made and data is shifted between the plurality of registers, wherein after each access all of the registers contain data.

27. The system as defined in claim 26 wherein the memory means comprises a FIFO.

28. The system as defined in claim 26 wherein each of the register means comprises a FIFO.

29. The system as defined in claim 14 further comprising an arbitration means coupled to the plurality of bit stream generators for arbitrating access to the memory means when at least two of the plurality of bit stream generators request data from memory at the same time.

30. The system as defined in claim 14 wherein the plurality of bit stream generators use at least one Rx(k) code, where x and k are integers.

31. The system as defined in claim 14 wherein the plurality of bit stream generators use R2(k) and Rn(k) codes, where n is an integer other than the integer 2.

32. The system as defined in claim 31 wherein n is 3, such that the plurality of bit-stream generators use R2(k) and R3(k) codes.

33. The system as defined in claim 14 wherein the plurality of bit stream generators use variable length to variable length codes.

34. The system as defined in claim 14 wherein the plurality of bit stream generators decoded probability classes in parallel using cascaded codes.

35. The system as defined in claim 14 wherein at least one of the codes comprises the code wherein data input is decoded (→) according to

| |
|---|
| 0000 → 0 |
| 0001 → 1000 |
| 0010 → 1001 |
| 0011 → 11111 |
| 010 → 101 |
| 011 → 11101 |
| 100 → 110 |
| 101 → 11110 |
| 11 → 11100 | for one of the probability classes.

36. The system as defined in claim 14 wherein each of the plurality of bit stream generation means use a binary arithmetic coder.

37. A method for decompressing a data stream of a plurality of codewords comprising the steps of:
   producing decoded results using a plurality of bit stream generators in response to data in a plurality of data streams supplied from the data stream, wherein each of the plurality of data streams corresponds to a particular context bin, and further wherein at least two of the decoded results are produced as the same time, such that decoded results are generated in parallel; and
   selecting the decoded results singularly to output the decompressed data according to the deterministic order of the data, such that the data stream is decoded in parallel.

38. The method as defined in claim 37 wherein the step of selecting includes the step of outputting the decoded data in parallel.

39. A method for decompressing a data stream of a plurality of codewords comprising the steps of:
   producing decoded results using a plurality of bit stream generators in response to data in a plurality of data streams supplied from the data stream, wherein each of the plurality of data streams corresponds to a particular probability class and further wherein at least two of the decoded results are produced as the same time, such that decoded results are generated in parallel; and
   selecting the decoded results singularly to output the decompressed data according to the deterministic order of the data, such that the data stream is decoded in parallel.

40. A system for decoding a coded data stream of a plurality of bits comprising:
   a memory coupled to receive and store the coded data stream;
   a decoder coupled to the memory, wherein the decoder receives coded data from the memory and decodes the coded data;
   a plurality of counters coupled to receive the decoded data from the decoder, wherein the plurality of counters generate decoded results, such that at least two of the plurality of counters have decoded results available at the same time;
   a modeling mechanism coupled to receive the decoded results produced by the plurality of counters, wherein the modeling mechanism selects the plurality of counters singularly to obtain its decoded result to produce decompressed data.

41. A method for decompressing a data stream of a plurality of codewords comprising the steps of:
   providing a plurality of data streams, wherein each of the plurality of channels supplies data corresponding to a particular context bin;
   producing a decoded result in response to the data in the plurality of data streams using a plurality of bit-stream generators, wherein each one of the plurality of bit stream generators provides decoded results for a distinct context bin and wherein at least two of the plurality of bit-stream generators produce decoded results at the same time;
   indicating the code to the plurality of bit stream generation means for decoding their individual data streams; and
   selecting the plurality of probability estimation means singularly to receive the decoded results produced by its associated bit stream generator to produce decompressed data, such that the data stream is decoded in parallel.

42. A method for decompressing a data stream of a plurality of codewords comprising the steps of:

providing a plurality of data streams, wherein each of the plurality of channels supplies data corresponding to a particular probability class;

producing a decoded result in response to the data in the plurality of data streams using a plurality of bit-stream generators, wherein each one of the plurality of bit stream generators provides decoded results for a distinct probability class and wherein at least two of the plurality of bit-stream generators produce decoded results at the same time;

indicating the code to the plurality of bit stream generation means for decoding their individual data streams; and selecting the plurality of probability estimation means singularly to receive the decoded results produced by its associated bit stream generator to produce decompressed data, such that the data stream is decoded in parallel.

43. A system for decoding a data stream of a plurality of bits coded according to a coding scheme employing contexts and probability estimates, said system comprising:

channel means for receiving the plurality of bits of the data stream;

decoding means coupled to the channel means for decoding portions of the plurality of bits in parallel, such that bits are decoded according to a coding-based partitioning, such that at least two streams of decoded data bits are generated; and modeling means coupled to receive the decoded data bits from the decoding means, wherein the modeling means selects decoded data bits from the decoding means singularly, such that the modeling means selects its output from a plurality of decoded data bit streams.

44. The system as defined in claim 43 wherein each of said at least two streams corresponds to at least one context bin different from context bins of other streams of decoded data bits, such that bits corresponding to different context bins are decoded in parallel.

45. The system as defined in claim 44 wherein each of said at least two streams corresponds to at least one probability class different from probability classes of other streams of decoded data bits, such that bits corresponding to different probability classes are decoded in parallel.

46. A system for decoding a coded data stream of a plurality of bits comprising:

a memory coupled to receive and store the coded data stream;

a decoder coupled to the memory, wherein the decoder receives the coded data from the memory and decodes the coded data, such that the run length is determined and whether a least probable symbol is at the end of the run is determined;

a plurality of counters coupled to receive the run length and least probable symbol determination from the decoder, wherein the plurality of counters generates decoded results, such that at least two of the plurality of counters have decoded results available at the same time;

a modeling mechanism coupled to receive the decoded results produced by the plurality of counters, wherein the modeling mechanism selects the plurality of counters singularly to obtain its decoded result to produce decompressed data.

47. A system for decoding a coded data stream of a plurality of bits comprising:

memory means for receiving and storing the coded data stream;

decoding means coupled to the memory means for receiving coded data from the memory means and decoding the coded data;

a plurality of counter means coupled to receive the decoded data from the decoding means and for generating decoded results, such that at least two of the plurality of counter means have decoded results available at the same time;

modeling means coupled to receive the decoded results produced by the plurality of counter means, wherein the modeling means selects the plurality of counter means singularly to obtain its decoded result to produce decompressed data.

48. The system as defined in claim 47 wherein the coded data is received by the decoding means as the decoding means outputs decoded data to the plurality of counter means, such that the system operates in a pipelined manner.

49. A system for decoding a coded data stream of a plurality of bits comprising:

memory means for receiving and storing the coded data stream;

decoding means coupled to the memory means for receiving coded data from the memory means and decoding the coded data, such that the run length is determined and whether a least probable symbol is at the end of the run is determined;

a plurality of counters coupled to receive the run length and least probable symbol determination from the decoding means and for generating decoded results, such that at least two of the plurality of counters have decoded results available at the same time;

modeling means coupled to receive the decoded results produced by the plurality of counters, wherein the modeling means selects the plurality of counters singularly to obtain its decoded result to produce decompressed data.

50. A real-time video system for decompressing a data stream of a plurality of codewords comprising:

first decoding means coupled to receive the data stream for decoding each codeword in the data stream, wherein at least two of the codewords in the data stream are decoded at the same time according to a coding-based partitioning of the data stream, such that the data stream is decoded in parallel;

second decoder means or further decoding the decoded data stream to prepare the decoded data stream for display; and display means for displaying the decoded data.

51. The system as defined in claim 50 wherein the display means comprises a television monitor.

52. The system as defined in claim 50 wherein the display means comprises a video monitor.

53. The system as defined in claim 50 wherein the second decoder means is a lossy decoder.

54. The system as defined in claim 53 wherein the lossy decoder comprises the transform portion of a decoder.

55. The system as defined in claim 53 wherein the lossy decoder comprises the color conversion portion of a decoder.

56. The system as defined in claim 53 wherein the lossy decoder comprises the subsampling portion of a decoder.

57. A system for encoding a data stream having a plurality of bits comprising:

a memory means for storing the data stream;

means coupled to the memory means for providing a plurality of data streams from the data stream, wherein each of the plurality of data streams includes data from the data stream corresponding to a particular context bin;

plurality of encoding means coupled to the means for providing a plurality of data streams, said plurality of encoding means for encoding the data, such that the data is encoded in parallel, wherein one of the plurality of encoding means is coupled to one of the plurality of data streams;

storage means coupled to received the encoded data from the plurality of encoding means; and ordering means coupled to the storage means for accessing the storage means to produce an ordered coded stream.

58. The system as defined in claim 57 wherein the ordering means includes a decoder means for requesting the coded data, such that the order for the compressed data is ascertained.

59. The system as defined in claim 58 wherein the decoder means comprises:

a plurality of decoders coupled to the storage means for decoding data from the storage means;

modeling means for providing a context to the plurality of decoders, such that the plurality of decoders decode data in the order given by the modeling means.

60. The system as defined in claim 59 further comprising arbitration means for arbitrating the data requests from the plurality of decoders, such that each of the plurality of decoders receives data of the proper context bin.

61. The system as defined in claim 57 wherein the storage means comprises a plurality of bit pack buffers.

62. The system as defined in claim 57 wherein the ordering means includes means for appending the encoded data from the storage means into a sequence of data.

63. A system for encoding a data stream having a plurality of bits comprising:

a memory means for storing the data stream;

means coupled to the memory means for providing a plurality of data streams from the data stream, wherein each of the plurality of data streams includes data from the data stream corresponding to a particular probability class;

plurality of encoding means coupled to the means for providing a plurality of data streams, said plurality of encoding means for encoding the data, such that the data is encoded in parallel, wherein one of the plurality of encoding means is coupled to one of the plurality of data streams;

storage means coupled to received the encoded data from the plurality of encoding means; and ordering means coupled to the storage means for accessing the storage means to produce an ordered coded stream.

64. The system as defined in claim 63 wherein the ordering means includes a decoder means for requesting the coded data, such that the order for the compressed data is ascertained.

65. The system as defined in claim 64 wherein the decoder means comprises:

a plurality of decoders coupled to the storage means for decoding data from the storage means;

modeling means for providing a context to the plurality of decoders, such that the plurality of decoders decode data in the order given by the modeling means.

66. The coder as defined in claim 64 wherein the state table comprises a symmetrical state table, such that only the positive or negative states of the table are stored.

67. The system as defined in claim 63 wherein the ordering means includes means for appending the encoded data from the storage means into a sequence of data.

68. An entropy decoder for decoding a data stream of a plurality of codewords comprising:

a bit stream generator coupled to receive the data stream; and a probability estimation mechanism coupled to the bit stream generator, wherein the probability estimation mechanism provides probability estimates to the bit stream generator, wherein the bit stream generator generates decoded results for each codeword in the data stream in response to probability estimates from the probability estimation mechanism, wherein the bit stream generator provides decoded results using at least a first $R_n(k)$ code and a second $R_n(k)$ code having a value of n different than the first $R_n(k)$ code.

69. The coder as defined in claim 68 wherein the probability estimation mechanism a state machine having positive and negative states.

70. The coder as defined in claim 68 wherein the probability estimation mechanism comprises a state machine.

71. The coder as defined in claim 70 wherein the state machine includes at least two states having the same $R_n(k)$ code.

72. The coder as defined in claim 70 wherein the state machine includes a plurality of states, and wherein each of the plurality of states is associated with an $R_n(k)$ code, and further wherein at least two of the plurality of states in the state machine are adjacent and associated with the same $R_n(k)$ code, such that bit-stream generator uses the same $R_n(k)$ codes to provide decoded results when transitioning between each of said at least two of the plurality of states.

73. The coder as defined in claim 68 wherein the bit stream generator uses $R_2(k)$ and $R_n(k)$ codes, where n is an integer other than 2.

74. The coder as defined in claim 73 wherein n is 3, such that bit-stream generator uses $R_2(k)$ and $R_3(k)$ codes.

75. An entropy decoder or decoding a data stream of a plurality of codewords comprising:

a bit stream generator coupled to receive the data stream; and a state table coupled to the bit stream generator, wherein the state table provides a probability estimate to the bit stream generator, wherein the state table includes a plurality of states, each of which is associated with a code, and further wherein at least two of the plurality of states include the same code, such the bit stream generator generates a decoded result for each codeword in the data stream in response to the probability estimate from the state table using a $R_n(k)$ codes, where n and k are integers.

76. A system for decoding a compressed data stream of a plurality of bits comprising:
  decoder means for decoding the data stream, wherein a run length and an indication of whether the Least Probable Symbol (LPS) occurred in response to the plurality of bits is generated, wherein the decoder means includes a state table having a plurality of states, each of which is associated with a code, and further wherein at least two states associated with the same code, such upon transitioning between said at least two, the decoder means uses the same code; and
  counter means coupled to decoder means for outputting decoded data in response to the LPs and run length.

77. The system as defined in claim 76 wherein the codes comprise R2(k) and Rn(k) codes, where n is an integer.

78. The system as defined in claim 77 wherein n is 3, such that the codes comprise R2(k) and R3(k) codes.

79. The system as defined in claim 76 wherein the decoder means comprises:
  run length decoding means coupled to receive the data stream as codewords, wherein the run length decoding means determining the codeword type;
  probability estimation means coupled to the run length decoding means, wherein the probability estimation means determines the code for the run length decoding means, such that the run length decoding means generates the run length and an indication of whether the LPS occurred in response to each codeword and the code.

80. The system as defined in claim 79 further comprising shifting means for receiving the data stream and outputting properly aligned coded data to the run-length decoding means.

81. The system as defined in claim 80 wherein the shifting means provides coded data to the run-length decoding means in response to a signal from the probability estimation means indicating the length of the previous codeword.

82. The system as defined in claim 76 wherein the counter means includes means to indicate to the decoding means when the next codeword is to be processed.

83. A system for decompressing a data stream of a plurality of codewords comprising:
  channel means for supplying the plurality of codewords of the data stream; and
  decoding means coupled to said channel means for decoding each codeword in the data stream, wherein the decoding means includes a plurality of decoders for decoding the data stream according to probability classes using codes, wherein the plurality of decoders are coupled in a cascaded manner, each having an input of the previous one of the cascaded coders and a data input corresponding to a probability class, and further wherein each of the plurality of coders outputs a code stream at a probability different than the probability of the data input, such that the data stream is decoded by receiving data at an input in the cascaded chain of coders and having the data propagate through the remainder of the cascaded chain to produce decoded data.

84. The system as defined in claim 83 wherein at least one of the codes comprises the code wherein data input is decoded (→) according to

```
0000 → 0
0001 → 1000
0010 → 1001
0011 → 11111
 010 → 101
 011 → 11101
 100 → 110
 101 → 11110
  11 → 11100
``` for one of the probability classes.

* * * * *